(12) United States Patent
Wang et al.

(10) Patent No.: US 12,453,135 B2
(45) Date of Patent: Oct. 21, 2025

(54) THIN FILM TRANSISTOR, SHIFT REGISTER UNIT, GATE DRIVING CIRCUIT AND DISPLAY PANEL

(71) Applicant: BOE TECHNOLOGY GROUP CO., LTD., Beijing (CN)

(72) Inventors: Lizhong Wang, Beijing (CN); Guangcai Yuan, Beijing (CN); Ce Ning, Beijing (CN); Hehe Hu, Beijing (CN); Nianqi Yao, Beijing (CN); Dongfang Wang, Beijing (CN); Zhengliang Li, Beijing (CN); Liping Lei, Beijing (CN); Chen Xu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/292,558

(22) PCT Filed: Jun. 30, 2022

(86) PCT No.: PCT/CN2022/102945
§ 371 (c)(1),
(2) Date: Jan. 26, 2024

(87) PCT Pub. No.: WO2024/000451
PCT Pub. Date: Jan. 4, 2024

(65) Prior Publication Data
US 2025/0089303 A1     Mar. 13, 2025

(51) Int. Cl.
*G09G 3/20*     (2006.01)
*G11C 19/28*     (2006.01)
(Continued)

(52) U.S. Cl.
CPC ........... *H10D 30/6757* (2025.01); *G09G 3/20* (2013.01); *G11C 19/28* (2013.01); *H10D 62/151* (2025.01);
(Continued)

(58) Field of Classification Search
CPC .... H10D 30/6757; H10D 62/151; G09G 3/20; G09G 2310/0267; G09G 2310/0286; G11C 19/28
See application file for complete search history.

(56) References Cited

U.S. PATENT DOCUMENTS

2001/0000627 A1    5/2001    Hayakawa et al.
2008/0169462 A1*   7/2008    Nakamura ............. H10K 19/10
                                                     257/E39.007
(Continued)

FOREIGN PATENT DOCUMENTS

CN    101154713 A    4/2008
CN    101217154 A    7/2008
(Continued)

OTHER PUBLICATIONS

International Search Report in PCT/CN2022/102945 in Chinese dated Jan. 3, 2023 with English translation.
(Continued)

*Primary Examiner* — Robert J Michaud
(74) *Attorney, Agent, or Firm* — Collard & Roe, P.C.

(57) ABSTRACT

A thin film transistor, a shift register unit, a gate driving circuit and a display panel are provided. The M source branches and the N drain branches extend along a first direction and are arranged at intervals; in each of the P source-drain units, the M source branches and the N drain branches are alternately arranged, and M is greater than or equal to N; a semiconductor layer includes sub-channel regions between one drain branch and one source branch (Continued)

adjacent to each other; a sum of widths of the sub-channel regions of the P source-drain units in the first direction is W, and an average length of the sub-channel regions of the P source-drain units in a direction perpendicular to the first direction is L; $12 \leq W/L \leq 400$, P, M and N are integers greater than or equal to 1, and $P \times N \geq 4$.

17 Claims, 7 Drawing Sheets

(51) Int. Cl.
    *H10D 30/67*     (2025.01)
    *H10D 62/13*     (2025.01)
(52) U.S. Cl.
    CPC ............... *G09G 2310/0267* (2013.01); *G09G 2310/0286* (2013.01)

(56) References Cited

U.S. PATENT DOCUMENTS

| | | | |
|---|---|---|---|
| 2009/0050900 A1* | 2/2009 | Masuda | H10D 64/257 257/E29.081 |
| 2015/0372020 A1 | 12/2015 | Mao et al. | |
| 2016/0372487 A1* | 12/2016 | Wang | H10D 30/6729 |
| 2020/0193932 A1 | 6/2020 | Liu et al. | |
| 2022/0344480 A1 | 10/2022 | Wang et al. | |

FOREIGN PATENT DOCUMENTS

| | | |
|---|---|---|
| CN | 104091830 A | 10/2014 |
| CN | 104465787 A | 3/2015 |
| CN | 109309100 A | 2/2019 |
| CN | 110619856 A | 12/2019 |
| CN | 112925139 A | 6/2021 |
| CN | 113851485 A | 12/2021 |
| KR | 20070081255 A | 8/2007 |

OTHER PUBLICATIONS

Written Opinion of the International Searching Authority in PCT/CN2022/102945 in Chinese dated Jan. 3, 2023.

* cited by examiner

THIN FILM TRANSISTOR, SHIFT REGISTER UNIT, GATE DRIVING CIRCUIT AND DISPLAY PANEL

CROSS REFERENCE TO RELATED APPLICATIONS

This application is the National Stage of PCT/CN2022/102945 filed on Jun. 30, 2022, the disclosure of which is incorporated by reference.

TECHNICAL FIELD

At least one embodiment of the present disclosure provides a thin film transistor, a shift register unit, a gate driving circuit and a display panel.

BACKGROUND

Switching elements in the field of display technology play an important role in high-quality display devices. For example, the conductivity of thin film transistor (TFT), as a switching element, directly affects the turn-on degree of TFT and the deflection degree of liquid crystal molecules, thus affecting the display images.

At present, it is mainly to put forward higher requirements for the charging current of TFT. Generally, the charging current of the TFT is increased by increasing the width-length ratio of the TFT channel. For example, especially for the gate row driving circuit (GOA circuit) manufactured in the non-display region on the array substrate, the requirements for charging current of the TFT in the circuit is higher, and the size requirement of the TFT manufactured in the non-display region of the array substrate is lower than the TFT in the pixel design, so a TFT with larger area and higher charging current is designed.

The material of TFT semiconductor layer mainly include amorphous silicon (a-Si) or oxide (such as IGZO (Indium Gallium Zinc Oxide)), etc. With the requirements for products with high PPI (Pixels Per Inch), high refresh rate and narrow frame, traditional a-Si thin film transistor products can no longer meet the requirements of device performance, and oxide technology as a new type technology which is the most likely substitute for the a-Si thin film transistor products has become the key point of the current research.

SUMMARY

At least one embodiment of the present disclosure provides a thin film transistor including a source electrode, a drain electrode, a gate electrode and a semiconductor layer. The source electrode includes a source wire and P source units that are electrically connected with the source wire, each of the P source units includes M source branches, and the M source branches each extends along a first direction and are arranged at intervals in a second direction intersecting the first direction; the drain electrode includes a drain wire and P drain units which are electrically connected with the drain wire and in one-to-one correspondence with the P source units, each of the P drain units includes N drain branches, and the N drain branches each extends along the first direction and are arranged at intervals in the second direction; the thin film transistor includes P source-drain units, one source unit and one corresponding drain unit constitute one source-drain unit; in each source-drain unit in the P source-drain units, the M source branches and the N drain branches are alternately arranged, separated from each other and insulated, and M is greater than or equal to N; the gate electrode is insulated from the source electrode and the drain electrode; the semiconductor layer is electrically connected with M source branches and N drain branches of each of the source-drain units, and includes a plurality of sub-channel regions located in each source-drain unit in the P source-drain units, and each of the plurality of sub-channel regions is located between one of the drain branches and one of the source branches that are adjacent to each other; a sum of widths of the plurality of sub-channel regions of the P source-drain units in the first direction is W, and an average length of the plurality of sub-channel regions of the P source-drain units in a direction perpendicular to the first direction is L; $12 \leq W/L \leq 400$, P, M and N are integers greater than or equal to 1, and $P \times N \geq 4$.

For example, in the thin film transistor provided by at least one embodiment of the present disclosure, $112 \leq W/L \leq 400$, and $P \times N \geq 6$.

For example, in the thin film transistor provided by at least one embodiment of the present disclosure, $P \geq 3$ and $N \geq 2$.

For example, in the thin film transistor provided by at least one embodiment of the present disclosure, $P \times N \geq 12$.

For example, in the thin film transistor provided by at least one embodiment of the present disclosure, $P \times N \geq 16$.

For example, in the thin film transistor provided by at least one embodiment of the present disclosure, $235 \leq W/L \leq 400$, and $P \times N \geq 32$.

For example, in the thin film transistor provided by at least one embodiment of the present disclosure, $W/L < 180$, and W ranges from 10 μm to 1600 μm.

For example, in the thin film transistor provided by at least one embodiment of the present disclosure, $W/L > 180$, and L ranges from 4 μm to 15 μm.

For example, in the thin film transistor provided by at least one embodiment of the present disclosure, the source-drain units are arranged in at least one unit row, and each unit row in the at least one unit row comprises at least one source-drain unit; in one same unit row, a distance between adjacent source-drain units is d, $W \geq 500$ μm, and d ranges from 50 μm to 500 μm.

For example, in the thin film transistor provided by at least one embodiment of the present disclosure, the source-drain units are arranged in at least one unit row, and each unit row in the at least one unit row comprises at least one source-drain unit; in one same unit row, a distance between adjacent source-drain units is d, $W < 500$ μm, and d ranges from 20 μm to 300 μm.

For example, in the thin film transistor provided by at least one embodiment of the present disclosure, the source-drain units are arranged in at least two unit rows, and each unit row in the at least one unit row comprises at least one source-drain unit.

For example, in the thin film transistor provided by at least one embodiment of the present disclosure, the semiconductor layer comprises a sub-portion overlapping with each source-drain unit in the plurality of source-drain units, the sub-portion comprises Q semiconductor branches, and the plurality of sub-channel regions comprise sub-channel units of the Q semiconductor branches that are between the adjacent ones of the drain branches and the source branches, where Q is an integer greater than or equal to 1; W is a sum of widths of the sub-channel units of the Q semiconductor branches of the P source-drain units in the first direction, and L is an average length of the sub-channel units of the P source-drain units in the direction perpendicular to the first direction.

For example, in the thin film transistor provided by at least one embodiment of the present disclosure, the semiconductor layer comprises a sub-portion overlapping with each source-drain unit in the plurality of source-drain units, and a plurality of sub-portions overlapping with the source-drain units constitute a continuous integrated structure.

For example, in the thin film transistor provided by at least one embodiment of the present disclosure, the source-drain units are arranged in a region between the source wire and the drain wire which are adjacent to each other, so as to enable the source-drain units to be arranged into at least two unit rows, and each unit row in the at least two unit rows comprises at least one source-drain unit; the source branches of the at least one source-drain unit in each of the unit rows are electrically connected to the same one source wire, and the drain branches of the at least one source-drain unit in each of the unit rows are electrically connected to the same one drain wire.

At least one embodiment of the present disclosure further provides a shift register unit including any one of the thin film transistors provided by the embodiments of the present disclosure.

For example, in the shift register unit provided by at least one embodiment of the present disclosure, the gate row driving circuit comprises an input circuit, an output circuit and a first node reset circuit; the input circuit is connected with a first node and configured to charge the first node in response to an input signal; the output circuit is connected with the first node and configured to output an output signal at an output terminal under control of a level signal of the first node; the first node reset circuit is connected with the first node and configured to reset the first node in response to a reset signal; the output circuit, the input circuit and the first node reset circuit all comprise the thin film transistor according to claim 1.

For example, in the shift register unit provided by at least one embodiment of the present disclosure, the output terminal comprises a shift output terminal and a scan signal output terminal; the output circuit comprises a first output transistor and a second output transistor; a gate electrode of the first output transistor is connected with the first node, a first electrode of the first output transistor is connected with a clock signal terminal to receive a clock signal, and a second electrode of the first output transistor is connected with the shift output terminal; a gate electrode of the second output transistor is connected with the first node, a first electrode of the second output transistor is connected with the clock signal terminal to receive the clock signal, and a second electrode of the second output transistor is connected with the scan signal output terminal; the clock signal is transmitted to the output terminal as the output signal; the first output transistor and the second output transistor are both the thin film transistors according to claim 1; the first output transistor and the second output transistor both satisfy $P \geq 3$ and $N \geq 2$, or, the first output transistor and the second output transistor both satisfy $P \times N \geq 12$, or, the first output transistor and the second output transistor both satisfy $P \times N \geq 16$.

For example, in the shift register unit provided by at least one embodiment of the present disclosure, the first output transistor satisfies $235 \leq W/L \leq 400$, and $P \times N \geq 32$.

At least one embodiment of the disclosure further provides a gate driving circuit, and the gate driving circuit includes any one of the shift register units provided by the embodiments of the disclosure, and the gate driving circuit includes a plurality of shift register units which are cascaded; except for shift register units from a 1-st stage to a s-th stage, pre-charging control terminals of shift register units of other stages are connected with the output terminals of shift register units of previous stages which are separated by at least s stages; except for the shift register units from the 1-st stage to the s-th stage, input terminals of the shift register units of other stages are connected with the output terminals of shift register units of previous stages which are separated by $(s-1)$ stages; except for shift register units of last s stages, the reset terminals of shift register units of other stages are connected with the output terminals of shift register units of previous stages which are separated by $(s-1)$ stages; s is an integer greater than 2.

At least one embodiment of the present disclosure further provides a display panel, and the display panel includes any one of the gate driving circuits provided by the embodiments of the present disclosure.

For example, in the display panel provided by at least one embodiment of the present disclosure, the display panel comprises a display region and a non-display region surrounding at least a part of the display region; the non-display region comprises a gate driving circuit region and a circuit lead wire region. The gate driving circuit region extends along a longitudinal direction and provided with the gate driving circuit; the plurality of shift register units, which are cascaded, are arranged along the longitudinal direction; and the circuit lead wire region is provided with circuit lead wires extending along a transverse direction intersecting with the longitudinal direction and is adjacent to the gate driving circuit region; the circuit leads comprise a first lead wire connected with the gate driving circuit and a second lead wire connected with the display region; the plurality of shift register units which are cascaded comprise an end shift register unit located at one end of the circuit region close to the circuit lead wire region; in each of the plurality of shift register units, the output terminal comprises a shift output terminal and a scan signal output terminal; the output circuit comprises a first output transistor and a second output transistor; a gate electrode of the first output transistor is connected with the first node, a first electrode of the first output transistor is connected with a clock signal terminal to receive a clock signal, and a second electrode of the first output transistor is connected with the shift output terminal; a gate electrode of the second output transistor is connected with the first node, a first electrode of the second output transistor is connected with the clock signal terminal to receive the clock signal, and a second electrode of the second output transistor is connected with the scan signal output terminal; the clock signal is transmitted to the output terminal as the output signal; the first output transistor and the second output transistor are both thin film transistors according to claim 1; a value of $P \times N$ of the first output transistor and a value of $P \times N$ of the second output transistor in the end shift register unit are respectively greater than values of $P \times N$ of the first output transistors and values of $P \times N$ of the second output transistors in other shift register units in the plurality of shift register units which are cascaded.

BRIEF DESCRIPTION OF DRAWINGS

In order to more clearly explain the technical scheme of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1:
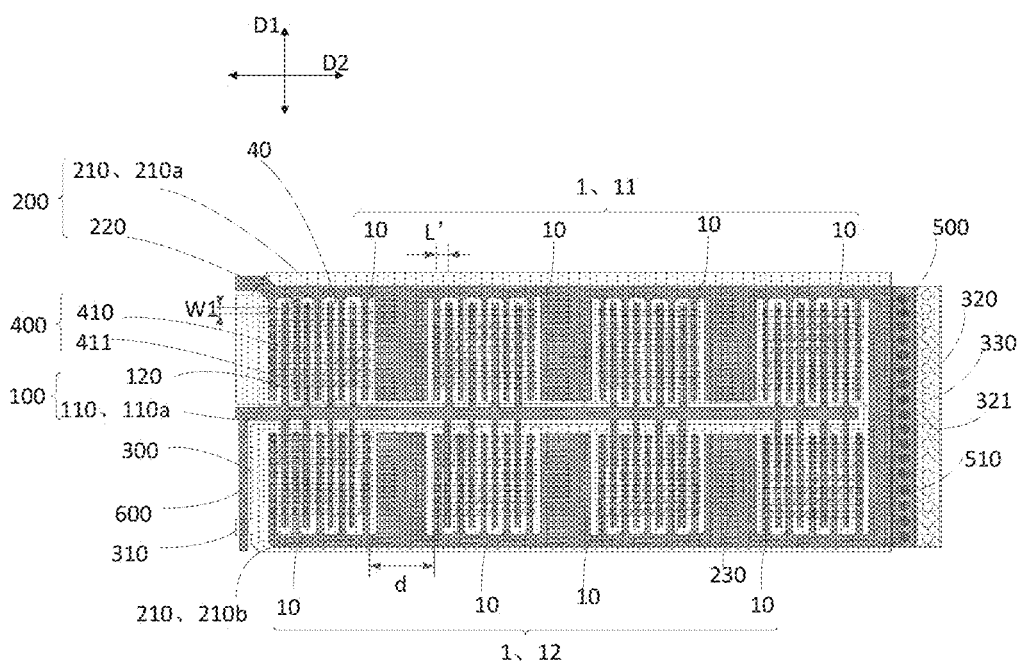
FIG. 1 is a schematic structural diagram of a thin film transistor provided by at least one embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. Similar words such as "connected" or "connected" are not limited to physical or mechanical connection, but can include electrical connection, whether direct or indirect. "Up", "down", "left" and "right" are only used to indicate the relative positional relationship. When the absolute position of the described object changes, the relative positional relationship may also change accordingly.

In the related art, the GOA (Gate Driver on Array) technology refers to a technology integrating a gate driver on an array substrate to form a scanning drive for the panel. Compared with the traditional COF (Chip On Flex/Film) and COG (Chip On Glass) processes, the main feature of the GOA technology is that it relies on the continuous triggering of the GOA driving units integrated on the array substrate to realize its shift register function, in which the original bonding region of the gate driver IC and the fanout wiring space are replaced, so that the panel can be designed symmetrically and beautifully on two sides, and the design of the narrow frame can be achieved, which reduces the cost and is also beneficial to the improvement of productivity and yield.

In the GOA circuit, the material of TFT semiconductor layer mainly include amorphous silicon (a-Si) or oxide (such as IGZO, namely indium gallium zinc oxide), etc. With the requirements for products with high PPI (Pixels Per Inch), high refresh rate and narrow frame, the traditional a-Si thin film transistor products can no longer meet the requirements of device performance, and oxide technology as a new type technology which is the most likely substitute for the a-Si thin film transistor products has become the key point of the current research.

Generally, a GOA circuit includes a plurality of thin film transistors, and each thin film transistor includes a plurality of source branches, a plurality of drain branches, a plurality of semiconductor branches, a source wire and a drain wire; the source branches are connected to the source wire, the drain branches are connected to the drain wire, and the source branches and the drain branches are divided into a plurality of units (TFT units).

Because the current on the source branch and the drain branch is closely related to the heat generated, it is the most direct and effective way to solve the heat problem of GOA circuit by increasing the number of branches to reduce the current on each branch and then reduce the heat of each branch. However, this method is suitable for amorphous silicon thin film transistor (a-Si TFT) with small mobility. For a large-size oxide thin film transistor (Oxide TFT), because of the high ion mobility of the Oxide TFT, it is easy to generate heat, and the heat problem is more serious. The main reasons are provided as follows: first, there are too many source branches and drain branches, and the source branches and drain branches are arranged in a high aggregation form, it is easy to lead to heat accumulation; secondly, the heat at the contact positions between the oxide semiconductor layer and the source branches and drain branches is the most serious, meanwhile, because the contact portions between the source branches and drain branches and the semiconductor layer are all on the wires where the current is concentrated, the wires where the current is concentrated are also prone to generate high heat, which further aggravates the accumulation of heat, and the accumulated heat will reduce the reliability of the display panel. Moreover, the width of the channel region is too large, and the numbers of source branches and drain branches are not appropriate, which will also increase the drift of the threshold voltage of the thin film transistor, thereby affecting the stability of the performance and the reliability of the thin film transistor.

At present, the mobility of conventional oxide transistors, such as IGZO TFT, is below 10. However, for products with higher resolution and higher refresh frequency, the high mobility oxide has a very large problem of unstable device characteristics, especially the large width-length ratio will lead to a large increase in on-state current (Ion), and the device heat problem will be prominent, which will lead to an increase in the drift of the threshold voltage, and eventually lead to the problem of poor reliability of display devices, and affect the display effect of the GOA display panel.

At least one embodiment of the present disclosure provides a thin film transistor including a source electrode, a drain electrode, a gate electrode and a semiconductor layer. The source electrode includes a source wire and P source units that are electrically connected with the source wire, each of the P source units includes M source branches, and the M source branches each extends along a first direction and are arranged at intervals in a second direction intersecting the first direction; the drain electrode includes a drain wire and P drain units which are electrically connected with the drain wire and in one-to-one correspondence with the P source units, each of the P drain units includes N drain branches, and the N drain branches each extends along the first direction and are arranged at intervals in the second direction; the thin film transistor includes P source-drain units, one source unit and one corresponding drain unit constitute one source-drain unit; in each source-drain unit in the P source-drain units, the M source branches and the N drain branches are alternately arranged, separated from each other and insulated, and M is greater than or equal to N; the gate electrode is insulated from the source electrode and the drain electrode; the semiconductor layer is electrically connected with M source branches and N drain branches of each of the source-drain units, and includes a plurality of sub-channel regions located in each source-drain unit in the P source-drain units, and each of the plurality of sub-channel regions is located between one of the drain branches and one of the source branches that are adjacent to each other; a sum of widths of the plurality of sub-channel regions of the P source-drain units in the first direction is W, and an average length of the plurality of sub-channel regions of the P source-drain units in a direction perpendicular to the first direction is L; 12≤W/L≤400, P, M and N are integers greater than or equal to 1, and P×N≥4.

At least one embodiment of the present disclosure further provides a shift register unit including any one of the thin film transistors provided by the embodiments of the present disclosure.

At least one embodiment of the disclosure further provides a gate driving circuit, and the gate driving circuit includes any one of the shift register units provided by the embodiments of the disclosure, and the gate driving circuit includes a plurality of shift register units which are cascaded; except for shift register units from a 1-st stage to a s-th stage, pre-charging control terminals of shift register units of other stages are connected with the output terminals of shift register units of previous stages which are separated by at least s stages; except for the shift register units from the 1-st stage to the s-th stage, input terminals of the shift register units of other stages are connected with the output terminals of the shift register units of previous stages which are separated by (s−1) stages; except for shift register units of last s stages, the reset terminals of shift register units of other stages are connected with the output terminals of shift register units of previous stages which are separated by (s−1) stages; s is an integer greater than 2.

At least one embodiment of the present disclosure further provides a display panel, and the display panel includes any one of the gate driving circuits provided by the embodiments of the present disclosure.

Illustratively, FIG. 1 is a schematic structural diagram of the thin film transistor provided by at least one embodiment of the present disclosure. As illustrated by FIG. 1, the thin film transistor includes a source electrode 100, a drain electrode 200, a gate electrode 300 and a semiconductor layer 400. The source electrode 100 includes a source wire 110 and P source units electrically connected with the source wire 110, each of the P source units includes N source branches 120, and the N source branches 120 each extends along a first direction D1 and are arranged at intervals in a second direction D2 intersecting with the first direction D1; the drain electrode 200 includes a drain wire 210 and P drain units that are electrically connected to the drain wire 210 and the P drain units are in one-to-one correspondence with the P source units, each of the P drain units includes M drain branches 220, and the M drain branches 220 each extends along the first direction D1 and are arranged at intervals in the second direction D2; the thin film transistor includes P source-drain units 10, one source unit and one corresponding drain unit constitute one source-drain unit 10, and in each of the P source-drain units 10, N source branches 120 and M drain branches 220 are alternately arranged, separated from each other and insulated from each other, and M is greater than or equal to N; the gate electrode 300 is insulated from the source electrode 100 and the drain electrode 200; the semiconductor layer 400 is electrically connected to the N source branches 120 and the M drain branches 220 of each source-drain unit 10, and includes a plurality of sub-channel regions 40 located in each source-drain units 10 of the P source-drain units 10, each of the plurality of sub-channel regions 40 is located between one drain branch 220 and one source branch 120 that are adjacent to each other; a sum of widths of the plurality of sub-channel regions 40 of the P source-drain units 10 in the first direction D1 is W (hereinafter referred to as a total width of a channel region), and an average length of the plurality of sub-channel regions 40 of the P source-drain units 10 in a direction perpendicular to the first direction D1 is L (an average length of the sub-channel regions); 12≤W/L≤400, P, M and N are integers greater than or equal to 1, and P×N≥4.

Figure 4A:
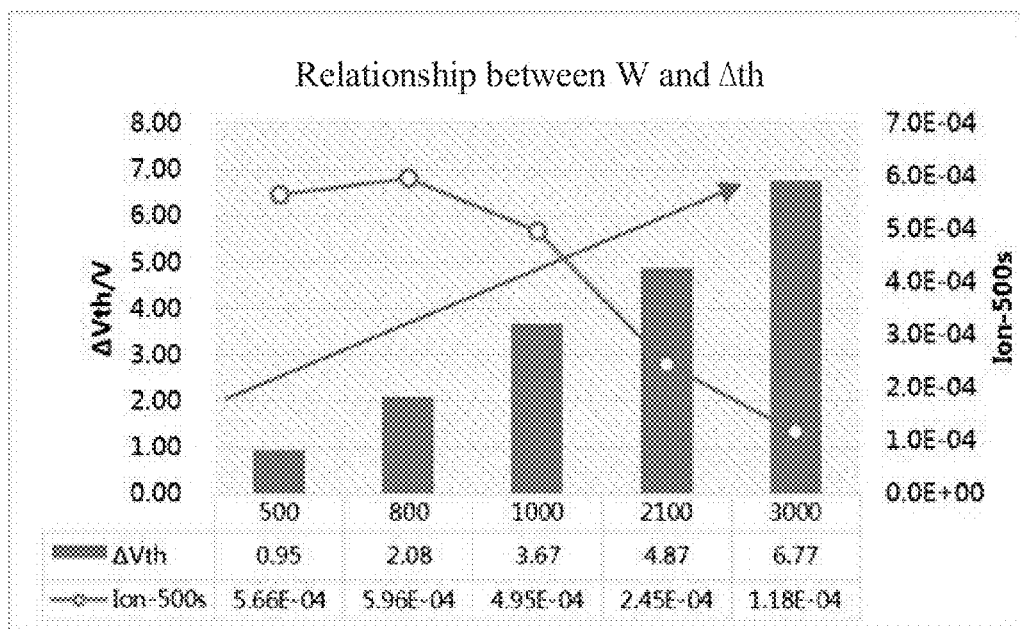
FIG. 4A is a diagram showing a relationship between a total width W of a channel region of the thin film transistor and a drift $\Delta th$ of the threshold voltage of the thin film transistor provided by at least one embodiment of the present disclosure.

Referring to FIG. 4A, FIG. 4A shows the cases that the total width W of the channel region of the thin film transistor is 500 μm, 800 μm, 1000 μm, 2100 μm and 3000 μm, respectively, so it can be seen that the drift Δth of the threshold voltage of the thin film transistor is positively correlated with W.

Figure 4B:
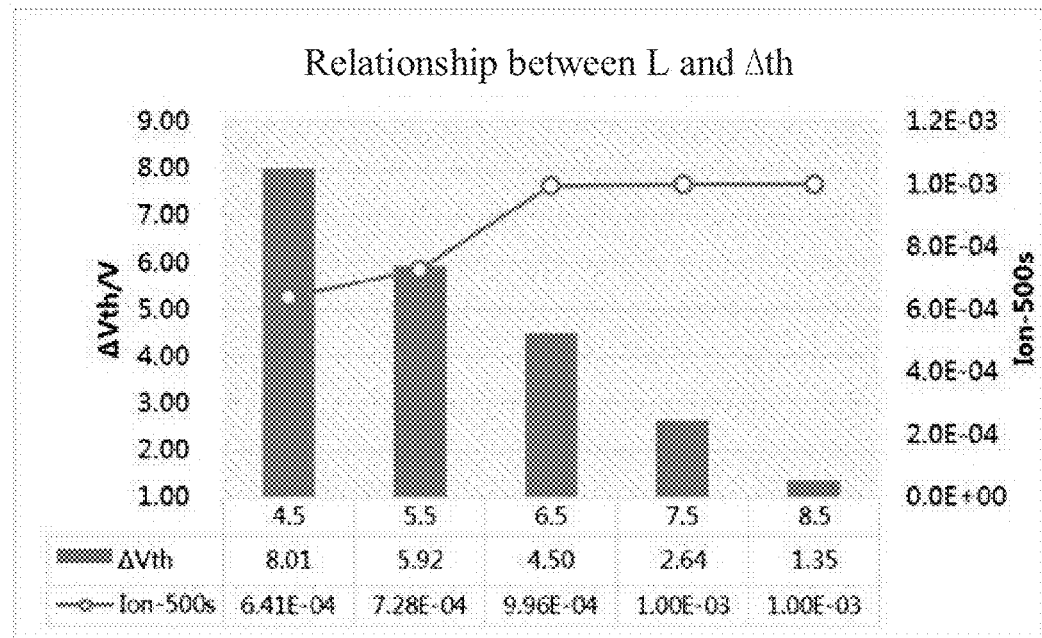
FIG. 4B is a diagram showing a relationship between an average length L of sub-channel regions of the thin film transistor and a drift $\Delta th$ of the threshold voltage of the thin film transistor provided by at least one embodiment of the present disclosure.

Referring to FIG. 4B, FIG. 4B shows the cases that the average length L of the sub-channel regions of the thin film transistor is 4.5 μm, 5.5 μm, 6.5 μm, 7.5 μm and 8.5 μm, respectively, so it can be seen that the drift Δth of the threshold voltage of the thin film transistor is negatively correlated with L.

Reducing the drift Δth of threshold voltage is beneficial to improving the charging rate of the thin film transistor, and the performance of thin film transistor is better. However, the increase of on-state current Ion will cause serious heat generation of the thin film transistor, so we hope that a smaller drift Δth of the threshold voltage is obtained, and meanwhile, the on-state current Ion is not too high; and the high on-state current Ion will also cause the drift Δth of the threshold voltage to be increased during the operation of the thin film transistor. Therefore, it is very important to explore the design boundary of the thin film transistor.

Through the research of the inventor(s), in the thin film transistor provided by the embodiment of the present disclosure, the inventor(s) established a relationship between W/L and P×N. Under the condition that 12≤W/L≤400, satisfying the condition P×N≥4 can effectively reduce the heat generation of the thin film transistor, reduce the drift Δth of the threshold voltage of the thin film transistor, improve the charging rate of the thin film transistor, and maintain the stability of the performance of the thin film transistor in the operation process, so as to improve the display effect of the display panel adopting a GOA driving circuit including the thin film transistor, and avoid excessively high on-state current Ion, and avoid a high-aggregation arrangement form of the source branches and drain branches caused by blindly increasing the number of source-drain units and the number of source branches and drain branches, so as to avoid heat accumulation caused by this high-aggregation arrangement mode. And for a specific range of W/L, an appropriate product of the number P of the source-drain units and the number N of the source branches in one source-drain unit can be found, so as to achieve a better technical effect of reducing the heat generation of thin film transistors, which is of great significance to the rational design of transistors. Especially for transistors with a large value of W (for example, W is greater than 100 μm), the effect of reducing the heat generation degree of thin film transistors is more obvious.

According to the relationship between W/L and P and N, the design boundary of the numbers of P and N can be controlled, and the design rules are clearer, so that the thin film transistors can be reasonably arranged in the circuit (for example, a GOA driving circuit) region of a display panel using a plurality of the thin film transistors provided by the embodiments of the present disclosure on the basis of foreseeable amelioration of the heat generation problem, and it is also beneficial to reasonably arranging a plurality of thin film transistors in the limited GOA region (a non-display region, for example, surrounding at least a part of the display region) of the display panel, to arrange more shift register units to drive more rows of pixels in the display region of the display panel, which is beneficial to driving the display panel with high PPI. Moreover, in the GOA region of the display panel with high PPI, the arrangement of thin film transistors in the GOA driving circuit is more dense, in this case, it is particularly needed to improve the heat dissipation of the thin film transistors. According to the relationship between W/L and the product of P and N, the design boundary can be effectively obtained, which can solve the heat problem of ameliorating the heat problem of thin film transistors and preventing the drift Δth of the threshold voltage of thin film transistors from being too large.

For example, the plurality of sub-channel regions 40 all have equal length, which is the length L' of one sub-channel region 40 in the first direction D1 in FIG. 1, that is, the above-mentioned L=L'. Of course, in other embodiments, the lengths of the plurality of sub-channel regions 40 may not all be equal. In short, the above-mentioned L is the average length of the plurality of sub-channel regions 40 of the P source-drain units 10 in the direction perpendicular to the first direction D1, and W is the sum of the widths of the plurality of sub-channel regions 40 of the P source-drain units 10 in the first direction D1.

In order to clearly explain the above meanings of P, M and N, the thin film transistor shown in FIG. 1 will be explained as an example in the following. For example, in the thin film transistor shown in FIG. 1, the number P of the source-drain units 10 is satisfies P=8, that is, the number of the source units is equal to 8, and that is, the number of the drain units is equal to 8. N source branches 120 in one source-drain unit 10 constitute one source unit, and M drain branches 220 in one source-drain unit 10 constitute one drain unit. For example, in the thin film transistor shown in FIG. 1, M=5, N=4 and M=N+1. Of course, in other embodiments, M may be equal to N.

It should be noted that "alternately arranged" herein refers to being arranged according to the rule that one source branch 120, one drain branch 220, one source branch 120, one drain branch 220 . . . , or the rule that one drain branch 220, one source branch 120, one drain branch 220, one source branch 120 . . . .

For example, in the case that 112≤W/L≤400, it is satisfied that P×N≥6. Through experimental research, further, in the case that 112≤W/L≤400, that is, for a relatively large value of W/L (W/L is equal to at least 112), satisfying P×N≥6 can more effectively reduce the heat generation degree of the thin film transistor, reduce the drift Δth of the threshold voltage of the thin film transistor, and maintain the stability of the performance of the thin film transistor in the operation process, thereby improving the display effect of the display panel using the GOA driving circuit including the thin film transistor. For example, especially for a transistor with a large value of W, for example, W≥950 μm, in the case that 112≤W/L≤400, and P×N≥6, the heat generation degree of thin film transistors is significantly reduced.

Figure 3A:
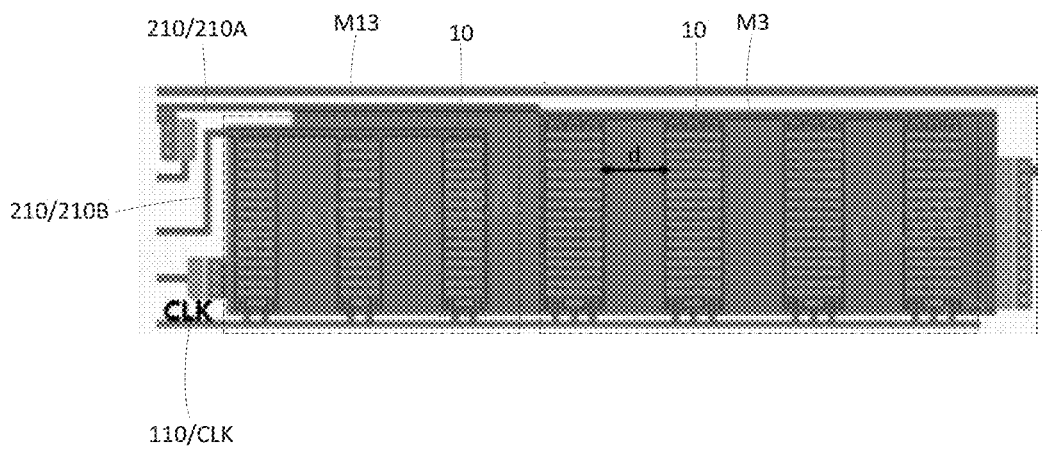
FIG. 3A is a schematic structural diagram of two transistors in a shift register unit provided by at least one embodiment of the present disclosure.

For example, in the case that 112≤W/L≤400, it is satisfied that P×N≥6, P≥3 and N≥2. As illustrated by FIG. 3A, FIG. 3A shows a structure of a thin film transistor M13 and a thin film transistor M3. In FIG. 3A, the thin film transistor M13 satisfies 112≤W/L≤400, and in the thin film transistor M13, P=3 and N=2.

For example, further, in the case that 112≤W/L≤400, it is satisfied that P×N≥12, the heat generation degree of the thin film transistor can be effectively reduced.

For example, further, it is satisfied that P≥4 and N≥3. As illustrated by FIG. 3A, the thin film transistor M3 also satisfies 112≤W/L≤400, and in the thin film transistor M3, P=4 and N=3. After the experimental verification, the heat problem of the thin film transistor M3 has been significantly ameliorated, and the design boundary of the number of P and N can be controlled, and the design rules are more clear.

For example, further, it is satisfied that P×N≥16, so as to further effectively reduce the heat generation degree of the thin film transistor.

Figure 3B:
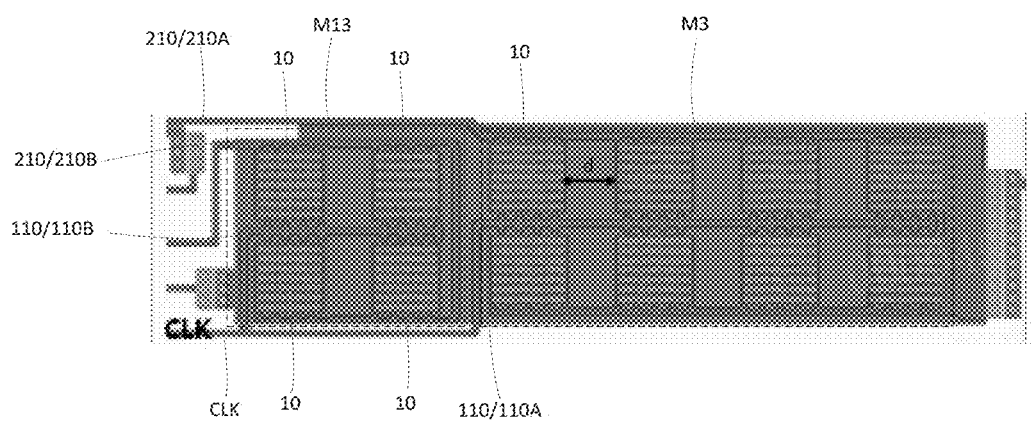
FIG. 3B is a schematic structural diagram of two transistors in another shift register unit provided by at least one embodiment of the present disclosure.

For example, further, it is satisfied that P≥4 and N≥4. As illustrated by FIG. 3B, FIG. 3B shows another structure of the thin film transistor M13 and the thin film transistor M3. In FIG. 3B, the thin film transistor M13 satisfies 112≤W/L≤400, and in the thin film transistor M13, P=4 and N=4.

For example, further, it is satisfied that 235≤W/L≤400, and P×N≥32. That is, for a relatively larger value of W/L (W/L is equal to at least 235), it is found through experiments that satisfying 235≤W/L≤400, and P×N≥32 can significantly reduce the heat generation degree of the thin film transistor, reduce the drift Δth of the threshold voltage of the thin film transistor, and maintain the stability of the performance of the thin film transistor in the operation process, thus improving the display effect of the display panel using the GOA driving circuit including the thin film transistor.

For example, further, it is satisfied that P≥8 and N≥4, so as to further effectively reduce the heat generation degree of the thin film transistor. In FIG. 3B, the thin film transistor M3 satisfies 112≤W/L≤400, and in the thin film transistor M3, P=8 and N=4.

Figure 5A:
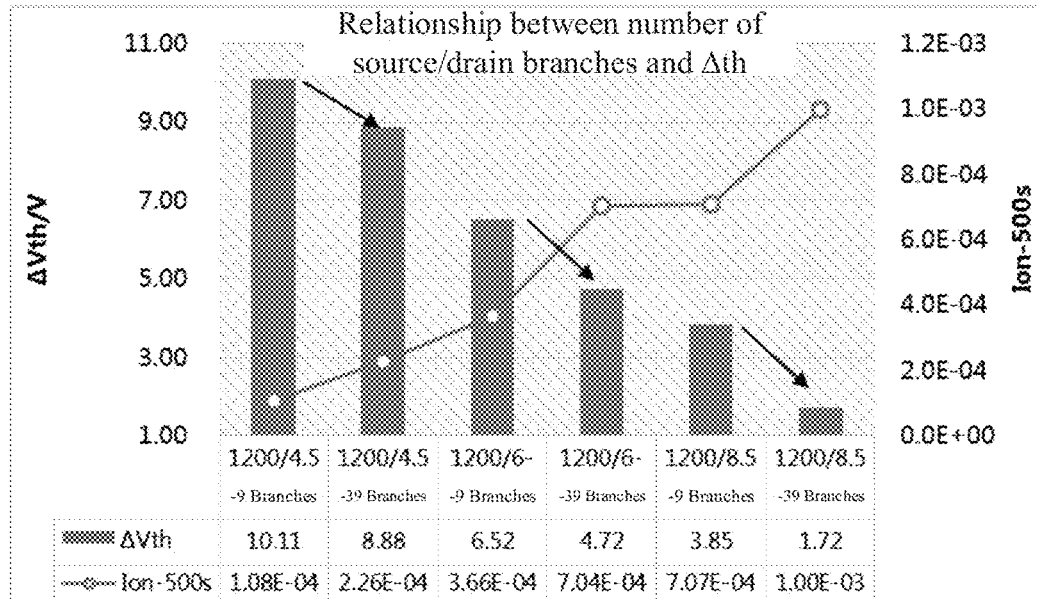
FIG. 5A is a diagram showing a relationship between the number of source/drain branches of a source-drain unit of the thin film transistor and a drift $\Delta th$ of the threshold voltage of the thin film transistor provided by at least one embodiment of the present disclosure.

As illustrated by FIG. 5A, in the case that the total width W of the channel region and the average length L of the sub-channel regions are the same, the drift Δth of the threshold voltage is negatively correlated with the number of source/drain branches in a certain range, and increasing the number of source/drain branches is also beneficial to reducing the heat generation degree of the thin film transistor. For example, in FIG. 5A, cases that W is 1200 μm, L is 4.5 μm, and the number N of source branches (where the number N of source branches represents the number of source/drain branches) is respectively 9 and 39, cases that W is 1200 μm, L is 6 μm, and the number N of source branches is respectively 9 and 39, and cases that W is 1200 μm, L is 8.5 μm, and the number N of source branches is respectively 9 and 39 are shown. Therefore, it can be seen that properly increasing the number of source/drain branches is beneficial to reducing the drift Δth of threshold voltage and reduce the heat generation degree of thin film transistor.

Figure 5B:
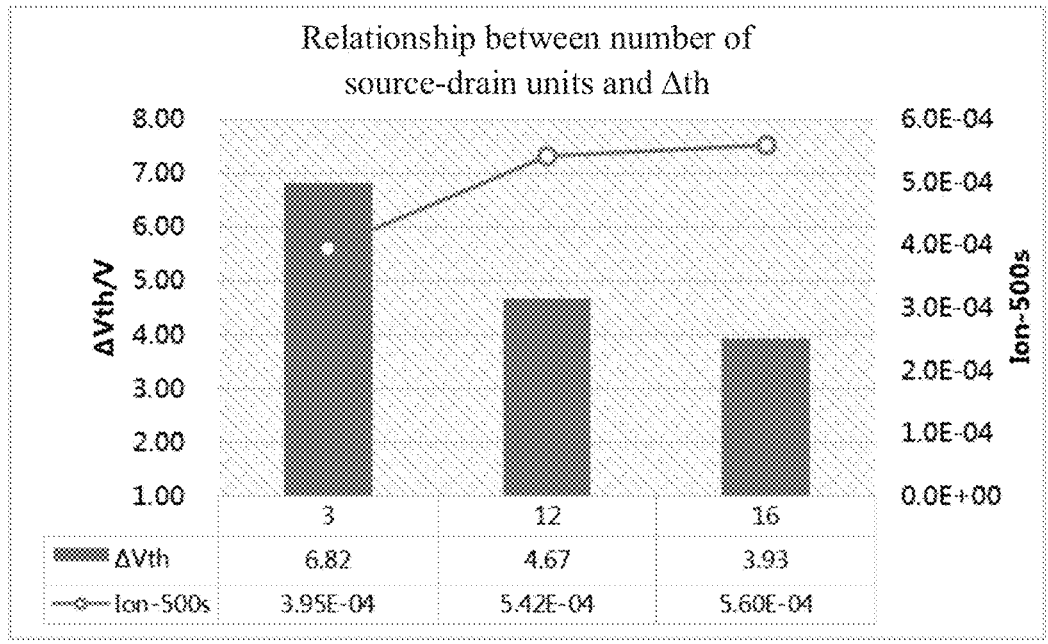
FIG. 5B is a diagram showing a relationship between the number of source-drain units of the thin film transistor and a drift $\Delta th$ of threshold voltage of the thin film transistor provided by at least one embodiment of the present disclosure.

As illustrated by FIG. 5B, FIG. 5B shows the cases that the number P of source-drain units is 2, 12 and 16, respectively. As seen, in a certain range, the drift Δth of the threshold voltage is negatively correlated with the number P of the source-drain units, and increasing the number of source/drain branches is also beneficial to reducing the heat generation degree of the thin film transistor.

In the technical solution of the present application, the relationship between W/L, P and N of each thin film transistor is an optimized design, which can provide a design boundary for the design of thin film transistors in the gate drive circuit and achieve better working performance of the gate drive circuit.

Figure 4C:
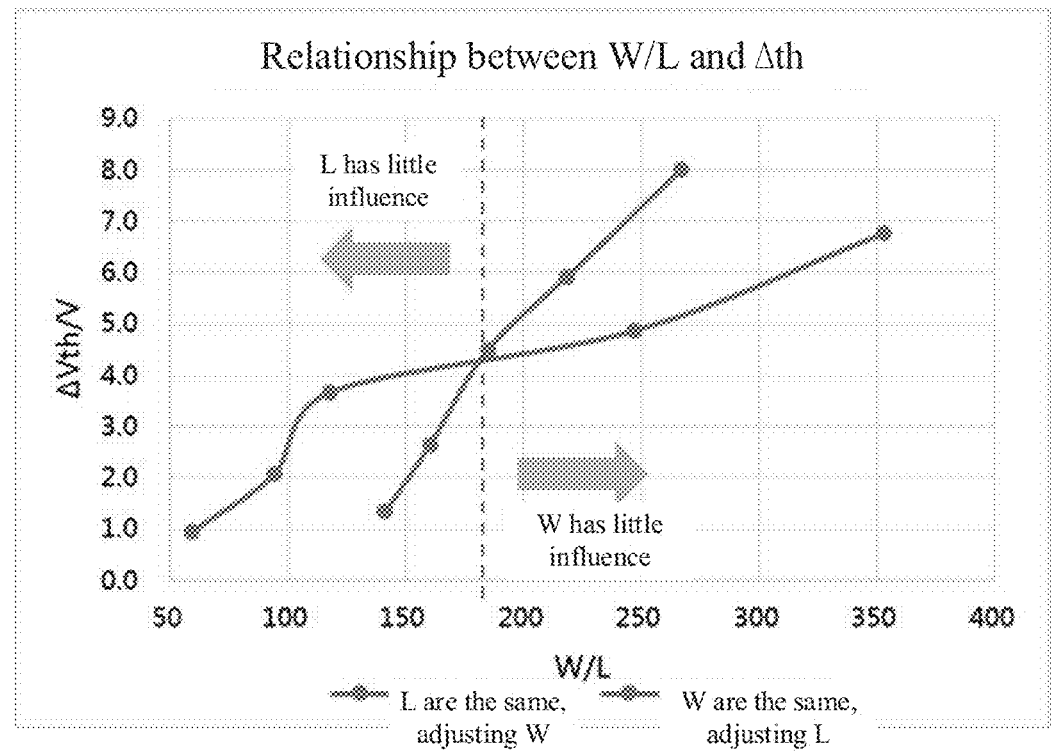
FIG. 4C is a diagram showing a relationship between a ratio W/L of a total width W of a channel region of the thin film transistor to an average length L of sub-channel regions of the thin film transistor and a drift $\Delta th$ of the threshold voltage of the thin film transistor provided by at least one embodiment of the present disclosure.

For example, in the thin film transistor provided by at least one embodiment, W/L<180, and W ranges from 10 μm to 1600 μm. FIG. 4C is obtained through experimental research. Referring to FIG. 4C, which shows the cases that the value of W/L of the thin film transistor ranges from 50 to 400. According to FIG. 4C, in the case that W/L<180 (at the intersection of two lines in FIG. 4C, W/L=180), the average length L of the sub-channel region has little influence on the drift Δth of the threshold voltage, while the total width W of the channel region has greater influence on the drift Δth of the threshold voltage compared with average length L of the sub-channel region. Therefore, in the case that W/L<180, adjusting the total width W of the channel region can more effectively adjust the drift Δth of the threshold voltage and improve the working performance of the thin film transistor. Through experimental research, in the case that W/L<180, it is satisfied that W ranges from 10 μm to 1600 μm, which can better reduce the drift Δth of the threshold voltage, ameliorate the heat problem of thin film transistors, and provide guidance for the design of channel region size of thin film transistors.

For example, in the thin film transistor provided by at least one embodiment, W/L>180, and L ranges from 4 μm to 15 μm. Referring to FIG. 4C, in the case that W/L>180, the total width W of the channel region has little influence on the drift Δth of the threshold voltage, while the average length L of the sub-channel regions has greater influence on the drift Δth relative to the total width W of the channel region. Therefore, in the case that W/L>180, adjusting the average length L of the sub-channel regions can more effectively adjust the drift Δth of the threshold voltage and improve the working performance of the thin film transistor. Through experimental research, in the case that W/L>180, L ranges from 4 μm to 15 μm, which can better reduce the drift Δth of threshold voltage, ameliorate the heat problem of thin film transistors, and provide guidance for the design of channel region size of thin film transistors.

For example, in the thin film transistor provided by at least one embodiment of the present disclosure, L ranges from 6 μm to 8.5 μm, so that it is more convenient to control the value of W/L, and it is easy to realize the appropriate size design of transistor.

Figure 5C:
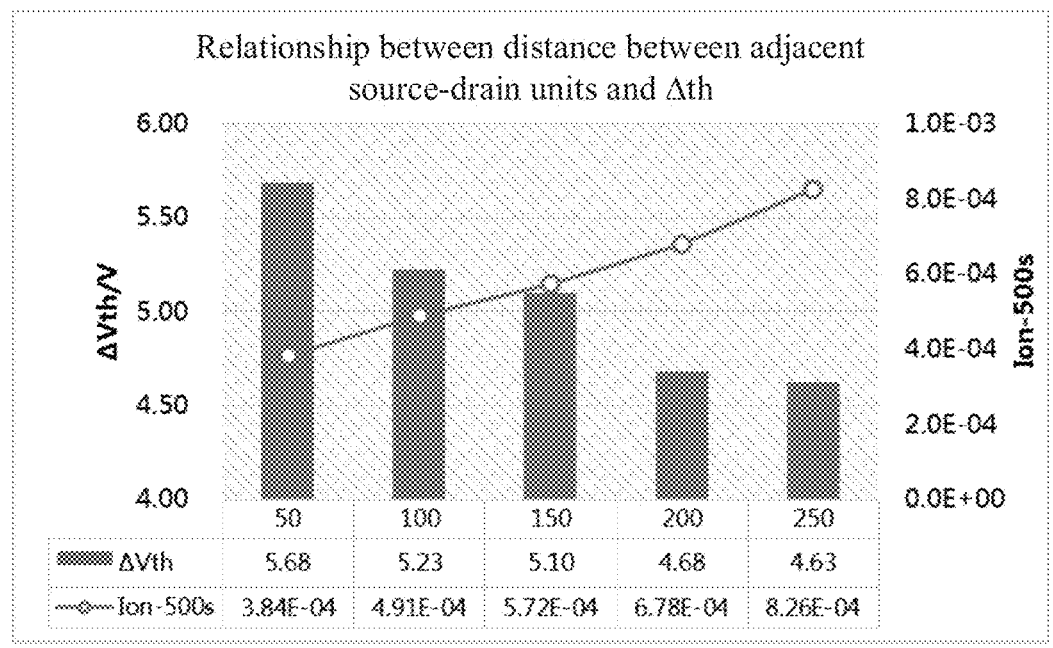
FIG. 5C is a diagram showing a relationship between a distance between adjacent source-drain units of the thin film transistor and a drift $\Delta th$ of threshold voltage of the thin film transistor provided by at least one embodiment of the present disclosure.

For example, the source-drain units 10 are arranged in at least one unit row 1, and each unit row 1 in the at least one unit row 1 includes at least one source-drain unit 10; in the same unit row 1, a distance between adjacent ones of the source-drain units 10 is d. Referring to FIG. 5C which shows the drift Δth of the threshold voltage and on-state current Ion in the cases that the distance d between adjacent ones of the source-drain units 10 is 50 μm, 100 μm, 150 μm, 200 μm and 250 μm respectively in the same one unit row 1. According to FIG. 5C, it can be seen that the drift Δth of the threshold voltage of the thin film transistor is negatively correlated with the distance d between adjacent ones of the source-drain units 10. The greater the distance d between adjacent ones of the source-drain units 10 in each unit row 1, the stronger the heat dissipation capacity, and the smaller the drift Δth of the threshold voltage, which is beneficial to improving the charging rate of the thin film transistor, and the better the performance of the thin film transistor. However, with the increase of the distance d, the on-state current Ion increases, and we hope that a smaller drift Δth of the threshold voltage is obtained, and meanwhile the on-state current Ion is not too large. A large on-state current Ion will also cause the drift Δth of the threshold voltage to be increased during the operation of the thin film transistor. Therefore, it is very important to explore the design boundary.

For example, in the thin film transistor provided by at least one embodiment, as illustrated by FIG. 1, W≥500 μm, and the distance d between adjacent ones of the source-drain units 10 in the same unit row 1 ranges from 50 μm to 500 μm. Through experimental research, in the case that 12≤W/L≤400 and P×N≥4, by combining the conditions that W≥500 μm and d ranges from 50 μm to 500 μm with the conditions that 12≤W/L≤400 and P×N≥4, a better effect of reducing the drift Δth of the threshold voltage of the thin film transistor can be achieved in the case that the total width W of the channel region of the thin film transistor is relatively large, so as to reduce the heat generation degree of the thin film transistor, which provides a design boundary for the design of the thin film transistor with the purpose of effectively reducing the drift Δth of the threshold voltage of the thin film transistor and reducing the heat generation degree of the thin film transistor, for the thin film transistor satisfying W≥500 μm.

For example, in another embodiment, W<500 μm, the distance between adjacent ones of the source-drain units 10 in the same one unit row 1 is d, and d ranges from 20 μm to 300 μm. Through experimental research, in the case that $12 \leq W/L \leq 400$ and $P \times N \geq 4$, by combining the conditions that $W<500$ μm and d ranges from 20 μm to 300 μm with the conditions that $12 \leq W/L \leq 400$ and $P \times N \geq 4$, a better effect of reducing the drift Δth of the threshold voltage of the thin film transistor can be achieved in the case that the total width W of the channel region of the thin film transistor is relatively large. so as to reduce the heat generation degree of the thin film transistor, which provides a design boundary for the design of the thin film transistor with the purpose of effectively reducing the drift Δth of the threshold voltage of the thin film transistor and reducing the heat generation degree of the thin film transistor, for the thin film transistor satisfying $W<500$ μm.

Of course, the above is only a concrete example. In practical application, the distance d between adjacent ones of source-drain units 10 in the same one unit row 1 is not limited thereto.

For example, as illustrated by FIG. 1, the source-drain units 10 are arranged in at least two unit rows 1, and each unit row 1 in the at least one unit row 1 includes at least one source-drain unit 10. For example, the plurality of source-drain units 10 are arranged in a region between the source wire 110 and the drain wire 210 that are adjacent to each other, to enable the plurality of source-drain units 10 to be arranged into at least two unit rows 1. For example, the first source wire 110a, the first drain wire 210a and the second drain wire 210b are arranged in parallel and at intervals; and the first source wire 110a is located between the first drain wire 210a and the second drain wire 210a, and a plurality of source-drain units 10 are arranged at intervals between the first source wire 110a and the first drain wire 210a to form a first unit row 11; and a plurality of source-drain units 10 are arranged at intervals between the first source wire 110a and the second drain wire 210b to form a second unit row 12. The drain branches 220 of each unit 10 in the first unit row 11 are all connected to the first drain wire 210a, and the drain branches 220 of each unit 10 in the second unit row 12 are all connected to the second drain wire 210a. That is, the source branches 120 of the at least one source-drain unit 10 in each unit row 1 are electrically connected to the same one source wire 110, and the drain branches 220 of the at least one source-drain unit 10 in each unit row 1 are electrically connected to the same one drain wire 210. The source branches 120 of each source-drain unit 10 in the first unit row 11 are all connected to one side of the first source wire 110a, and the source branches 120 of each source-drain unit 10 in the second unit row 12 are all connected to the other side of the first source wire 110a, that is, the source branches 120 in the first unit row 11 and the source branches 120 in the second unit row 12 share the same one first source wire 110.

Of course, in other embodiments, the source-drain units 10 of the thin film transistor may be arranged in only one unit row.

For example, in the thin film transistor illustrated in FIG. 1, the number of the source-drain units 10 in the first unit row 11 is four, the number of the source-drain units 10 in the second unit row 12 is four, and the total number of source-drain units 10 in the thin film transistor is eight. Of course, the number of the source-drain units 10 in each unit row 1 is not limited thereto. For example, the number of source-drain units 10 in each unit row 1 may be only two, so that, the total number of the source-drain units 10 in two unit rows 1 in the thin film transistor is still greater than three to improve the heat dissipation performance of the thin film transistor, or the number of the source-drain units 10 in the thin film transistor may be less than or equal to three according to actual needs.

Figure 2:
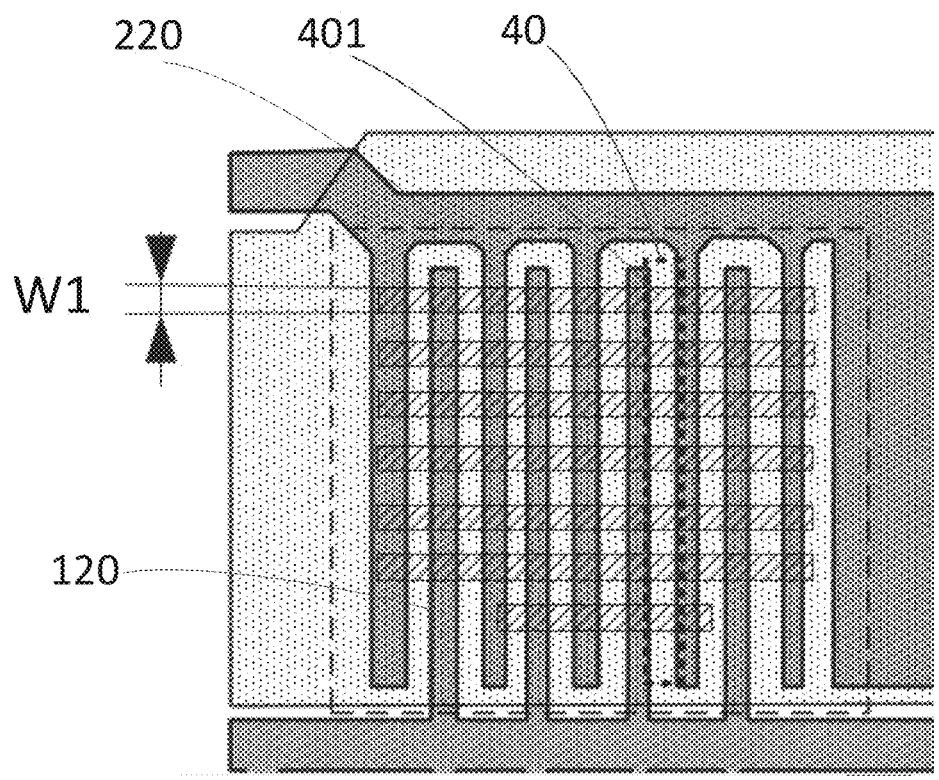
FIG. 2 is a partially enlarged schematic view of a source-drain unit of the thin film transistor shown in FIG. 1.

For example, with reference to FIGS. 1 and 2, the semiconductor layer 400 includes a sub-portion overlapping with each source-drain units 10 of the plurality of source-drain units 10, that is, the sub-portion overlaps with an orthographic projection of each source-drain units 10 of the plurality of drain units 10 on a plane defined by the first direction D1 and the second direction D2, each sub-portion includes Q semiconductor branches 410, and the plurality of sub-channel regions 40 include a plurality of sub-channel units 401 of the Q semiconductor branches 410 that are respectively located between one source branches 120 and one drain branches 220 which are adjacent to each other. In this case, the total width W of the channel region is a sum of the widths of the plurality of sub-channel units 401 of the Q semiconductor branches 410 of the P source-drain units 10 in the first direction D1, and the width of one sub-channel unit 401 in the first direction D1 is W1, that is, $W=W1 \times Q \times P$; L is an average length of all the plurality of sub-channel units 401 of the P source-drain units 10 in the direction perpendicular to the first direction D1, for example, the second direction D2 is perpendicular to the first direction D1, and L=a sum of lengths of all the plurality of sub-channel units 401 of the P source-drain units 10 in the second direction D2/a total number of all the plurality of sub-channel units 401, for example, in the case that the lengths of the plurality of sub-channel regions 40 are all equal, L=L'.

In addition, in the embodiment shown in FIG. 1, the orthographic projection of the gate electrode 300 on the base substrate does not overlap with the orthographic projection of the source wire 110 on the base substrate, and the orthographic projection of the gate electrode 300 on the base substrate overlaps with the orthographic projection of the drain wire 210 on the base substrate.

In the above-mentioned embodiment, the orthographic projection of the gate electrode 300 on the base substrate does not overlap with an orthographic projection of the first source wire 110a on the base substrate. For example, as illustrated by FIG. 1, the gate electrode 300 is hollowed out at the position where the first source wire 110a is arranged, so that an overlapping area of the gate electrode 300 and the first source wire 110a can be reduced, thereby reducing the CGS capacitance, that is, reducing the capacitance between the gate electrode 300 and the first source wire 110a to reduce the signal delay; in the meanwhile, the orthographic projection of the gate electrode 300 on the base substrate overlaps with the orthographic projection of the first drain wire 210a and the second drain wire 210b on the base substrate, for example, as illustrated by FIG. 1, the orthographic projections of the source branches 120 and the drain branches 220 in each unit 10 of the thin film transistor on the base substrate, and the orthographic projections of the first drain wire 210a and the second drain wire 210b on the base substrate all fall on the orthographic projection of the gate electrode 300 on the base substrate, so that the CGD capacitance can be increased, that is, the capacitance between the drain electrode 200 and the gate electrode 300 can be increased, to reduce signal noise.

In addition, in the embodiment shown in FIG. 1, in the case that the thin film transistor is applied, for example, in the case that the thin film transistor is applied in a GOA circuit, a first end of the first source wire 110a is connected to a clock pulse signal wire 600 in the GOA circuit, and the orthographic projection of the gate electrode 300 on the base substrate does not overlap with the orthographic projection of the clock pulse signal wire 600 on the base substrate, and the gate electrode 300 is connected to a gate wire 310, and the orthographic projection of the gate wire 310 on the base substrate overlaps with the orthographic projection of the clock pulse wire 600 on the base substrate.

In the above-mentioned embodiment, on the one hand, reducing the overlapping area between the gate electrode 300 and the clock pulse signal wire 600 can further reduce the CGS capacitance, that is, reducing the capacitance between the gate electrode 300 and the clock pulse signal wire 600 to reduce the signal delay; on the other hand, as illustrated by FIG. 1, in the case that the GOA circuit includes a plurality of thin film transistors, for example, the thin film transistor shown in FIG. 1 is described as an example, the thin film transistor is connected with gate electrodes 300 of other thin film transistors through a gate wire 310, the gate wire 310 is arranged at a side of the gate electrode 300 close to the clock pulse signal wires 600, and the gate electrode 300 includes a hollowed-out pattern at a side where the clock pulse signal wire 600 is located, so that the gate electrode 300 does not overlap with the clock pulse signal wire 600, and only the gate wire 310 overlaps with the clock pulse signal line 600. In this way, the hollowed-out pattern can increase the interval between the gate electrodes 300 of adjacent thin film transistors, thereby reducing the heat problem of the gate electrodes 300.

In addition, in the embodiment shown in FIG. 1, a drain electrode block 230 formed of a metal layer of the drain electrode 200 is arranged between two adjacent units 10, and the orthographic projection of the drain electrode block 230 on the base substrate overlaps with the orthographic projection of the gate electrode 300 on the base substrate, so that the CGD capacitance, that is, the capacitance between the metal layer where the drain electrode 200 is located and the gate electrode 300, can be increased, to further reduce the signal noise.

Of course, it can be understood that, in other embodiments, according to actual needs, the drain electrode block 230 may not be provided between two adjacent units 10.

In addition, in the embodiment shown in FIG. 1, one end of the drain wire 210 is connected to a signal output terminal 500, and a first gate metal pattern 320 formed of a metal layer of the gate electrode 300 is also arranged on the base substrate, the first gate metal pattern 320 is located at a side of the signal output terminal 500 and is independent and insulated from the gate electrode 300. The signal output terminal 500 is provided with a plurality of first via holes 510, and the first gate metal pattern 320 is provided with a plurality of second via holes 321, and the signal output terminal 500 is connected to an ITO layer (indium tin oxide) 330 through the first via holes 510, and the first gate metal pattern 320 is connected to the ITO layer 330 through the second via holes 321 to realize the electrical connection between the signal output terminal 500 and the first gate metal pattern 320, and the first gate metal pattern 320 is electrically connected with a pixel electrode of a display element through the second via holes 321.

In addition, as illustrated by FIG. 1, one end of the first source wire 110a is connected with the clock pulse signal wire 600, and the extension direction of the clock pulse signal wire 600 is perpendicular to the first source wire 110a; the signal output terminal 500 is connected to the same end connected to both the first drain wire 210a and the second drain wire 20b, and extends along a direction perpendicular to the extension direction of the first drain wire 210a, and the clock pulse signal wire 600 and the signal output terminal 500 are located at two opposite sides of the thin film transistor, respectively. Of course, positions of the clock pulse signal wire and the signal output terminal 500 are not limited thereto.

Figure 6A:
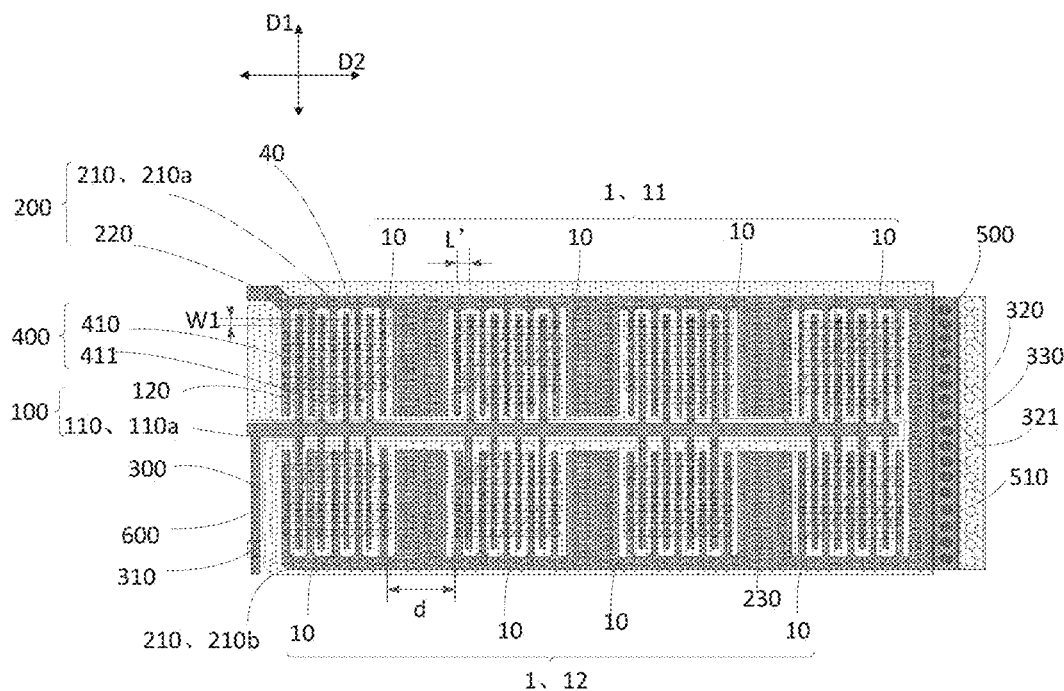
FIG. 6A is a structural schematic diagram of another thin film transistor provided by at least one embodiment of the present disclosure.

FIG. 6A is a schematic structural diagram of another thin film transistor provided by at least one embodiment of the present disclosure. The thin film transistor shown in FIG. 6A has the following differences from the thin film transistor shown in FIG. 1. In the embodiment shown in FIG. 6A, in each source-drain unit 10, at least one semiconductor branch 410 is designed to be a compensate semiconductor branch 411, and the total length of the channel of the compensate semiconductor branch 411 is smaller than the total length of the channel of each of other semiconductor branches 410 in the second direction D2. Other features and corresponding technical effects of the embodiment shown in FIG. 6A are the same as those of FIG. 1, which can be referred to the previous description and is not repeated herein.

Figure 6B:
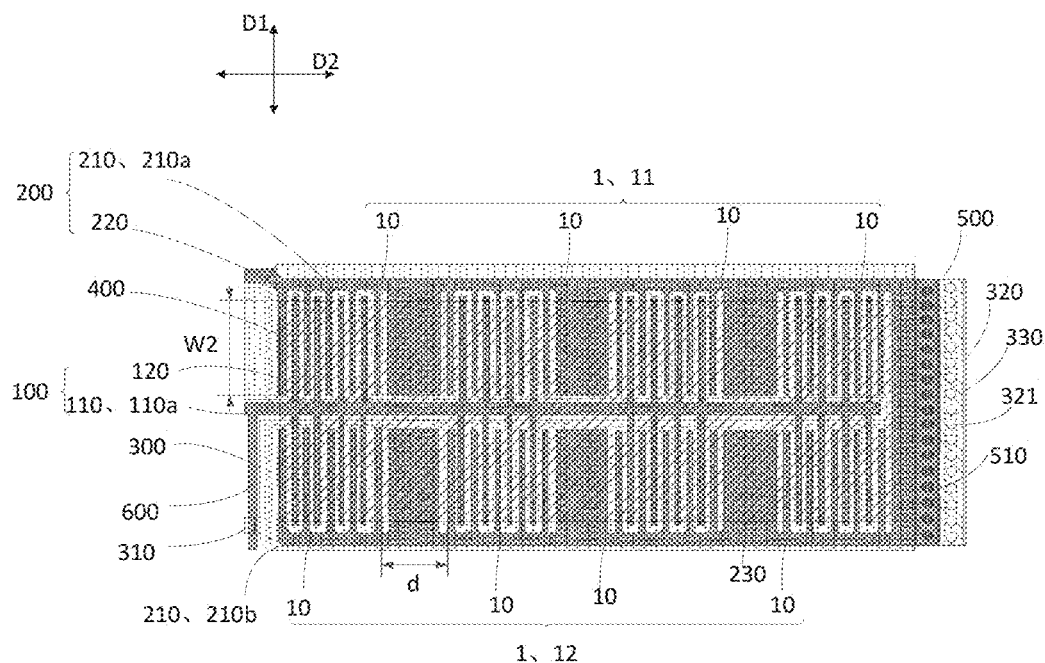
FIG. 6B is a schematic structural diagram of yet another thin film transistor provided by at least one embodiment of the present disclosure.

FIG. 6B is a schematic structural diagram of yet another thin film transistor provided by at least one embodiment of the present disclosure. The thin film transistor shown in FIG. 6B has the following differences from the thin film transistor shown in FIG. 1. In the embodiment shown in FIG. 6B, the semiconductor layer 400 includes a sub-portion overlapping with each source-drain unit 10 in the source-drain units 10, that is, the sub-portion overlaps with the orthographic projection of each drain unit 10 on a plane defined by the first direction D1 and the second direction D2, and the sub-portions overlapping with the plurality of source-drain units 10 constitute a continuous integrated structure. In this case, for example, the plurality of sub-portions constitute a continuous integrated structure, and W=W2×P. As long as there is no contradiction, other features and corresponding technical effects of the embodiment shown in FIG. 6B are the same as those of FIG. 1, so please refer to the previous description and the repeated portions is omitted herein.

In the embodiment of the present disclosure, the thin film transistor may be a P-type thin film transistor or an N-type thin film transistor, and the structure may be a bottom gate type, a top gate type or a double gate type, and the specific types of thin film transistors are not limited in the embodiment of the present disclosure.

At least one embodiment of the present disclosure further provides a shift register unit including any one of the thin film transistors provided by the embodiments of the present disclosure.

Figure 7:
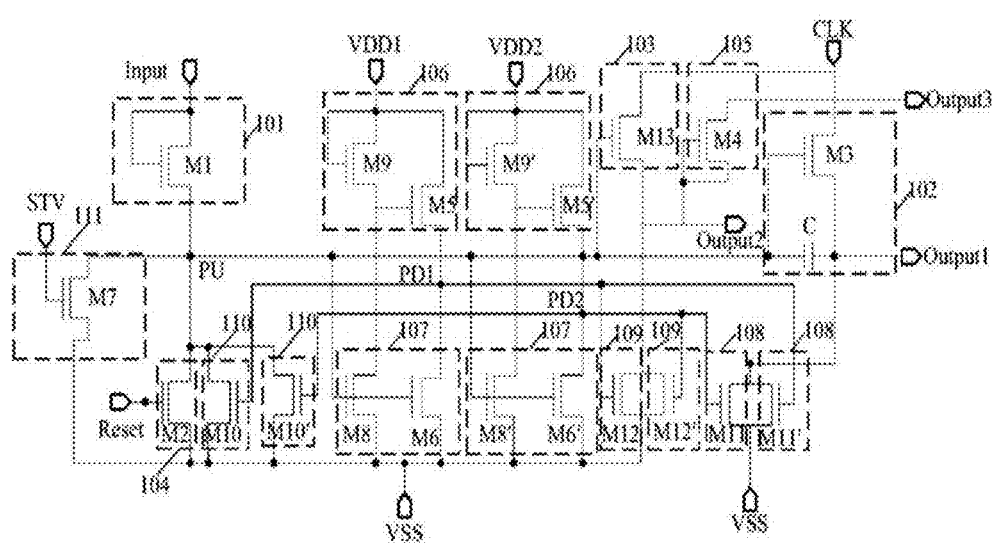
FIG. 7 is an exemplary circuit diagram of a shift register unit provided by at least one embodiment of the present disclosure.

FIG. 7 is an exemplary circuit diagram of a shift register unit provided by at least one embodiment of the present disclosure. As illustrated by FIG. 7, in the shift register unit 01, a gate row driving circuit includes an input circuit 101, output circuits 102/103 and a first node reset circuit 104; the input circuit 101 is connected with a first node PU and configured to charge the first node PU in response to an input signal; the output circuit 102/103 is connected with the first node PU and configured to output an output signal at an output terminal Output1 under the control of a level signal of the first node PU; the first node reset circuit 104 is connected with the first node PU and configured to reset the first node PU in response to a reset signal; the output circuit 102/103, the input circuit 101 and the first node reset circuit 104 all include any one of the thin film transistors provided by the embodiments of the present disclosure.

As illustrated by FIG. 7, the output terminal Output1 includes a scanning signal output terminal, i.e. the first output terminal Output1 and a shift output terminal, i.e. a second output terminal Output2; the output circuit includes a first output sub-circuit 102 and a second output sub-circuit 103. For example, the shift register unit 01 further includes a monitoring sub-circuit 105. The input circuit 101 is configured to pre-charge the pull-up node PU (i.e., the first node PU) through an input signal in response to the input signal; the pull-up node PU is a connection node among the input circuit 101, the first output sub-circuit 102, the second output sub-circuit 103 and the reset sub-circuit 104; the first output sub-circuit 102 is configured to output a clock signal through the first output terminal Output1 in response to the electric potential of the pull-up node PU; the second output sub-circuit 103 is configured to respond to the electric potential of the pull-up node PU, and output a synchronization signal which is synchronized with the signal output from the first output terminal Output1 through the second output terminal Output2; the reset sub-circuit 104 is configured to reset the electric potential of the pull-up node PU through a second power supply voltage in response to the reset signal; the monitoring sub-circuit 104 is configured to monitor the second output terminal Output2 and output a monitoring result through a third output terminal Output3.

Therefore, in the shift register unit, the first output sub-circuit 102 can output a GOA signal, such as a clock signal, through the first output terminal Output1, the second output sub-circuit 103 can output a synchronization signal which is synchronized with the signal output from the first output terminal Output1 through the second output terminal Output2, and the monitoring sub-circuit 104 can monitor the second output terminal Output2, and output a monitoring result through a third output terminal Output3 at the same time, so as to monitor the GOA signal output from the second output terminal Output2, and whether the GOA signal output from the shift register is abnormal or not can be judged. Therefore, the real-time monitoring of the GOA signal can be achieved, so that the change of the operating state of the GOA can be monitored during the product reliability process, and then the abnormal point of the GOA signal can be detected at the first time.

For example, in some examples, as illustrated by FIG. 7, the first shift register may further include at least one pull-down control sub-circuit 106, at least one pull-down sub-circuit 107, at least one first noise reduction sub-circuit 108, at least one second noise reduction sub-circuit 109 and at least one third noise reduction sub-circuit 110. The pull-down control sub-circuit 106 is configured to control the electric potential of the pull-down node PD through the first power supply voltage in response to the first power supply voltage; the pull-down node PD is a connection node between the pull-down control sub-circuit 106 and the pull-down sub-circuit 107; the pull-down sub-circuit 107 is configured to pull down the electric potential of the pull-up node PD through the second power supply voltage in response to the electric potential of the pull-up node PU; the first noise reduction sub-circuit 108 is configured to reduce the noise of the first output terminal Output1 through the second power supply voltage in response to the electric potential of the pull-down node PD; the second noise reduction sub-circuit 109 is configured to reduce the noise of the second output terminal Output2 by the second power supply voltage in response to the electric potential of the pull-down node PD; the third noise reduction sub-circuit 110 is configured to reduce the noise of the pull-up node PU by the second power supply voltage in response to the electric potential of the pull-down node PD.

For example, in some embodiments, as illustrated by FIG. 7, the first shift register unit may further include an initialization sub-circuit 111; the initialization sub-circuit 111 is configured to initialize the electric potential of the pull-up node PU by a second power supply voltage in response to an initialization signal.

Specifically, as illustrated by FIG. 7, the input circuit 101 includes a first transistor M1 (input transistor), the gate electrode and the source electrode of the first transistor M1 are both connected to the input signal terminal Input, and the drain electrode of the first transistor M1 is connected to the pull-up node PU. The Reset sub-circuit 104 includes a second transistor M2 (i.e., the above reset transistor), the gate electrode of the second transistor M2 is connected to a reset control signal terminal Reset, the source electrode of the second transistor M2 is connected to a second power supply voltage terminal VSS, and the drain electrode of the second transistor M2 is connected to the pull-up node PU. The first output sub-circuit 102 includes a third transistor M3 (i.e., the above-mentioned output transistor) and a storage capacitor C, the gate electrode of the third transistor M3 is connected to the pull-up node PU, the source electrode of the third transistor M3 is connected to a clock signal terminal CLK, and the drain electrode of the third transistor M3 is connected to the first output terminal Output 1; one end of the storage capacitor C is connected to the pull-up node PU, and the other end of the storage capacitor C is connected to the first output terminal Output1. The second output sub-circuit 103 includes a thirteenth transistor M13 (which is also an output transistor); the gate electrode of the thirteenth transistor M13 is connected to the pull-up node PU, the source electrode of the thirteenth transistor M13 is connected to the clock signal terminal CLK, and the drain electrode of the thirteenth transistor M13 is connected to the second output terminal Output2.

In an input stage, the signal input terminal Input writes a high-level signal, the first transistor M1 is turned on, and the high-level signal can pre-charge the pull-up node PU through the first transistor M1. In an output stage, the electric potential of the pull-up node PU is pre-charged and stored in the storage capacitor C. At this stage, the first transistor M1 is turned off, and the storage capacitor C is discharged to further increase the electric potential of the pull-up node PU, the third transistor M3 and the thirteenth transistor M13 are both turned on, the first output terminal Output1 outputs the high-level signal written by the clock signal terminal CLK, and the second output terminal Output2 outputs the synchronization signal which is synchronized with the signal output by the first output terminal Output1. In a reset stage, the reset control signal terminal Reset is written with a high-level signal, the second transistor M2 is turned on, and the electric potential of the pull-up node PU is reset by the low power supply voltage written through the second power supply voltage terminal VSS.

For example, the monitoring sub-circuit 105 includes a fourth transistor M4, the gate electrode and the source electrode of the fourth transistor M4 are both connected to the second output terminal Output2, and the drain electrode of the fourth transistor M4 is connected to the third output terminal Output3.

It should be noted that the gate electrode and source electrode of the fourth transistor M4 are connected to the second output terminal Output2 and the drain electrode of the fourth transistor M4 is connected to the third output terminal Output3, in the case that the GOA signal output from the second output terminal Output2 is a high-level signal, the fourth transistor M4 can be turned on under the control of the high-level signal, and the high-level signal is output through the third output terminal Output3. By comparing the high-level signal output from the third output terminal Output3 with a reference high-level signal, if the signal output by the third output terminal Output3 is the same as the reference high-level signal, it refers to that the GOA signal output by the second output terminal Output2 is normal; if the signal output by the third output terminal Output3 is different from the reference high-level signal or there is no output signal at the third output terminal Output3, it refers to that the GOA signal output by the second output terminal Output2 is abnormal, so that the real-time monitoring of the GOA signal can be achieved, so that the change of the operating state of the GOA can be monitored during the product reliability process, and then the abnormal point of the GOA signal can be detected at the first time, so as to avoid defects such as AD.

For example, the pull-down control sub-circuit 106 includes a ninth transistor M9 and a fifth transistor M5, the gate electrode and the source electrode of the ninth transistor M9 are both connected to a first power supply voltage terminal VDD, and the drain electrode of the ninth transistor M9 is connected to the gate electrode of the fifth transistor M5; the gate electrode of the fifth transistor M5 is connected to the drain electrode of the ninth transistor M9, the source electrode of the fifth transistor M5 is connected to the first power supply voltage terminal VDD, and the drain electrode of the fifth transistor M5 is connected to the pull-down node PD. The pull-down sub-circuit 107 includes a sixth transistor M6 and an eighth transistor M8, the gate electrode of the sixth transistor M6 is connected to the pull-up node PU, the source electrode of the sixth transistor M6 is connected to the pull-down node PD, and the drain electrode of the sixth transistor M6 is connected to a second power supply voltage terminal VSS, the gate electrode of the eighth transistor M8 is connected to the pull-up node PU, the source electrode of the eighth transistor M8 is connected to the drain electrode of the ninth transistor M9, and the drain electrode of the eighth transistor M8 is connected to the second power supply voltage terminal VSS. The first noise reduction sub-circuit 108 includes an eleventh transistor M11, the gate electrode of the eleventh transistor M11 is connected to the pull-down node PD, the source electrode of the eleventh transistor M11 is connected to the first output terminal Output1, and the drain electrode of the eleventh transistor M11 is connected to the second power supply voltage terminal VSS. The second noise reduction sub-circuit 109 includes a twelfth transistor M12, the gate electrode of the twelfth transistor M12 is connected to the pull-down node PD, the source electrode of the twelfth transistor M12 is connected to the second output terminal Output2, and the drain electrode of the twelfth transistor M12 is connected to the second power supply voltage terminal VSS. The third noise reduction sub-circuit 110 includes a tenth transistor M10, the gate electrode of the tenth transistor M10 is connected to the pull-down node PD and the source electrode of the tenth transistor M10 is connected to the pull-up node PU; the drain electrode of the tenth transistor M10 is connected to the second power supply voltage terminal VSS.

It should be noted that, in the example shown in FIG. 7, the case that two pull-down control sub-circuits 106, two pull-down sub-circuits 107, two first noise reduction sub-circuits 108, two second noise reduction sub-circuits 109 and two third noise reduction sub-circuits 110 are taken as an example for explanation. It can be understood that the number of each sub-circuit mentioned above can also be one or other, and the implementation principle is the same, so the repeated portions are omitted herein.

For example, in FIG. 7, the fifth transistors in the first one and the second one of the pull-down control sub-circuits 106 are denoted by M5 and M5' respectively, and the ninth transistors are denoted by M9 and M9' respectively; the sixth transistors in the first one and the second one of the pull-down circuits 5 are denoted by M6 and M6' respectively, and the eighth transistors are denoted by M8 and M8' respectively; the eleventh transistors in the first one and the second one of the first noise reduction circuits 108 are denoted by M11 and M11' respectively; the twelfth transistors M12 in the first one and the second one of the second noise reduction circuits 109 are denoted by M12 and M12' respectively; the tenth transistors in the first one and the second one of the third noise reduction circuits 110 are denoted by M10 and M10' respectively; the first power supply voltage terminals to which the first one and the second one of the pull-down control sub-circuits 106 are connected are denoted by VDD1 and VDD2, respectively. In addition, the first pull-down control sub-circuit 106 is connected with the first pull-down circuit 107, and the connection node between them is represented by the pull-down node PD1; the second pull-down control sub-circuit 106 is connected with the second pull-down circuit 107, and the connection node between them is denoted by the pull-down node PD2; the first noise reduction circuit 108 is connected to PD1, and the second first noise reduction circuit 108 is connected to PD2. The first one of the second noise reduction circuits 109 is connected to PD1 and the second one of the second noise reduction circuits 109 is connected to PD2. The first one of the third noise reduction circuits 110 is connected to PD1, and the second one of the third noise reduction circuits 110 is connected to PD2.

For example, in a scanning process of a frame of image, the first one of the pull-down control sub-circuits 106, the first one of the first pull-down circuits 107, the first one of the first noise reduction circuits 108, the first one of the second noise reduction circuits 109 and the first one of the third noise reduction circuits 110 operate, or, the second one of the pull-down control sub-circuits 106, the second one of the first pull-down circuits 107, the second one of the first noise reduction circuits 108 and the second one of the first noise reduction circuits 110 operate. That is, the numbers of the pull-down control sub-circuit 106, the first pull-down circuit 107, the first noise reduction circuit 108, the second noise reduction circuit 109, and the third noise reduction circuit 110 may all be multiple, and only one of the sub-circuits with the same function operates when one frame of image is scanned, and at the same time, another one of the sub-circuits with the same function can be switched to operate at a preset working time, thereby prolonging the life of the shift register unit. In a noise reduction stage, because the pull-up node PU is pulled down to a low level potential in the reset stage; the fifth transistor M5 and the ninth transistor M9 are always controlled by the first power supply voltage written by the first power supply voltage terminal VDD1. At this time, the electric potential of the pull-down node PD1 is a high-level signal, and the eleventh transistor M11 is turned on, the second power supply voltage written by the second power supply voltage terminal VSS denoises the output of the first output terminal Output1 through the eleventh transistor M11. At the same time, the twelfth transistor M12 and the tenth transistor M10 are also turned on, and the second power supply voltage written by the second power supply voltage terminal VSS denoises the outputs of the second output terminal Output2 and the pull-up node PU through the twelfth transistor M12 and the tenth transistor M10, respectively.

For example, the initialization sub-circuit 111 includes a seventh transistor M7, the gate electrode of the seventh transistor M7 is connected to an initialization signal terminal STV, the source electrode of the seventh transistor M7 is connected to the pull-up node PU, and the drain electrode of the seventh transistor M7 is connected to the second power supply voltage terminal VSS.

It should be noted that, when a next frame of image is displayed, the initialization signal terminal STV writes a high-level signal, and the seventh transistor M7 is turned on, and the electric potential of the pull-up node PU is initialized by the low power supply voltage written by the second power supply voltage terminal VSS, so as to prevent the images of adjacent frames from interfering with each other and affecting the display effect.

It can be understood that the first shift register unit and the second shift register unit provided by the embodiment of the present disclosure can be other circuit structures besides the above-mentioned 19T1C structure, such as 17T1C structure, 18T2C structure, 21T1C structure, etc. The embodiment of the present disclosure does not limit the specific structures of the first shift register unit and the second shift register unit. For example, in the case that the structures of the first shift register unit and the second shift register unit are 17T1C, compared with the above-mentioned 19T1C structure, the 17T1C may be free of the ninth transistors M9 and M9', but its implementation principle is the same as that of the above-mentioned 19T1C shift register unit, and the repeated portions are omitted herein.

For example, the first output sub-circuit 102 includes a first output transistor, and the third transistor M3 serves as the first output transistor; the second output sub-circuit 103 includes a second output transistor, and the thirteenth transistor M13 serves as the second output transistor; the gate electrode 300 of the first output transistor is connected with the first node PU, the first electrode of the first output transistor is connected with the clock signal terminal to receive the clock signal, and the second electrode of the first output transistor is connected with the shift output terminal Output2; the gate electrode 300 of the second output transistor is connected to the first node PU, the first electrode of the second output transistor is connected to the clock signal terminal to receive the clock signal, and the second electrode of the second output transistor is connected to the scan signal output terminal Output1; the clock signal is transmitted to the output terminal Output1 as an output signal; the first output transistor and the second output transistor are both thin film transistors provided by embodiments of the present disclosure.

The total widths W of the channel regions of the third transistor M3 and the thirteenth transistor M13 are both relatively large, and the drifts $\Delta$th of the threshold voltage are particularly large, and the heat generation are particularly serious. For example, both the third transistor M3 and the thirteenth transistor M13 satisfy P≥3 and N≥2, that is, both the first output transistor and the second output transistor satisfy P≥3 and N≥2; Alternatively, both the third transistor M3 and the thirteenth transistor M13 satisfy P×N≥12, that is, both the first output transistor and the second output transistor satisfy P×N≥12; Alternatively, both the third transistor M3 and the thirteenth transistor M13 satisfy P×N≥16, that is, both the first output transistor and the second output transistor satisfy P×N≥16, so as to better reduce the drifts $\Delta$th of the threshold voltages of the third transistor M3 and the thirteenth transistor M13, reduce the heat generation degrees of the third transistor M3 and the thirteenth transistor M13, ensure the shift register unit 01 to have better and more stable working performance and ensure a display panel adopting a gate driving circuit including the shift register unit 01 as a scanning driving circuit to have better display effect.

For example, in the shift register unit 01 provided by the embodiment of the present disclosure, the third transistor M3 and the thirteenth transistor M13 are transistors shown in FIG. 3A, respectively. The thirteenth transistor M13 satisfies 112≤W/L≤400, and in the thin film transistor M13, P=3 and N=2. The third transistor M3 satisfies 112≤W/L≤400, and in the thin film transistor M3, P=4 and N=3. The source electrode of the third transistor M3 and the source electrode of the thirteenth transistor M13 are both connected to the same one clock pulse signal line CLK; the drain electrode of the third transistor M3 and the drain electrode of the thirteenth transistor M13 are connected to the first drain wire 210A and the second drain wire 210B, respectively.

For example, the third transistor M3 satisfies 235≤W/L≤400, and P×N≥32. For example, the third transistor M3 and the thirteenth transistor M13 are the transistors shown in FIG. 3B, respectively. The thirteenth transistor M13 satisfies 112≤W/L≤400, and in the thin film transistor M13, P=4 and N=4. The third transistor M3 satisfies 112≤W/L≤400, and in the thin film transistor M3, P=8 and N=4. The source electrode of the third transistor M3 and the source electrode of the thirteenth transistor M13 are respectively connected with the first source wire 110A and the second source wire 110B, and the first source wire 110A and the second source wire 110B are connected with the same one clock pulse signal line CLK; the drain electrode of the third transistor M3 and the drain electrode of the thirteenth transistor M13 are connected to the first drain wire 210A and the second drain wire 210B, respectively.

For example, the first transistor M1, the second transistor M2, the sixth transistor M6, the eighth transistor M8/M8', the tenth transistor M10/M10' and the eleventh transistor M11/M11' are all thin film transistors provided by the embodiments of the present disclosure, all of which satisfy 12≤W/L≤400, both P and N are integers greater than or equal to 1, M is an integer greater than or equal to 2, and P×N≥4. Therefore, according to the relationship between values of W/L and P and N, the design limit of the values of P and N can be controlled, and the design rules are clearer, so that on the basis of foreseeable amelioration of the heat generation problem, in the display panel adopting the GOA driving circuit of the shift register unit 01, it is possible to reasonably arrange a plurality of thin film transistors in the limited GOA region (non-display region, e.g., at least partially surrounding the display region) of the display panel, and arrange more shift register units to drive more rows of pixels in the display region of the display panel, which is beneficial to driving the display panel with high PPI. Moreover, in the GOA region of the display panel with high PPI, the arrangement of thin film transistors in the GOA driving circuit is more dense. In this case, it is particularly needed to improve the heat dissipation of the thin film transistors. According to the relationship between the value of W/L and the product of P and N, the design boundary can be effectively obtained, the heat problem of the thin film transistor can be ameliorated, and the problem that the drift $\Delta$th of the threshold voltage of the thin film transistor is too large can be prevented.

For example, in the shift register unit shown in FIG. 7 provided by some embodiments, any other transistor except the first transistor M1, the second transistor M2, the sixth transistor M6/M6', the eighth transistor M8/M8', the tenth transistor M10/M10', the eleventh transistor M11/M11', the third transistor M3 and the thirteenth transistor M13 may also adopt the thin film transistor provided by the embodiment of the present disclosure. According to design requirements of different transistors, specific design can be conducted according to the design boundary of the thin film transistor provided by the embodiments of the present disclosure.

For example, the design data adopted by each thin film transistor in the shift register unit 01 shown in FIG. 7 are provided in the following table 1. By adopting this technical solution, each thin film transistor can be designed reasonably according to the functional requirements of each thin film transistor, taking into account the space and performance.

TABLE 1 data of the thin film transistors in a shift register unit

| TFT label | Total width W(µm) of channel region | Number P of source-drain unit in a preferable embodiment | Total number N × P of source branches in a preferable embodiment | Range of number P of source-drain units | Range of total number N × P of source branches |
|---|---|---|---|---|---|
| M1 | 400 | 2 | 00 | 1~8 | 1~20 |
| M2 | 150 | 2 | 4 | 1~6 | 1~10 |
| M3 | 2100 | 8 | 32 | 1~30 | 1~100 |
| M5/M59 | 20 | 1 | 1 | 1~4 | 1~3 |
| M6/M6' | 150 | 2 | 6 | 1~6 | 1~10 |
| M7 | 80 | 1 | 4 | 1~5 | 1~8 |
| M8/M8' | 120 | 2 | 4 | 1~6 | 1~10 |
| M9/M9' | 20 | 1 | 1 | 1~4 | 1~3 |
| M10/M10' | 120 | 2 | 6 | 1~6 | 1~10 |
| M11/M11' | 240 | 2 | 6 | 1~12 | 1~20 |
| M12/M12' | 80 | 2 | 4 | 1~4 | 1~10 |
| M13/M13' | 950 | 4 | 8 | 1~15 | 1~50 |

Figure 8:
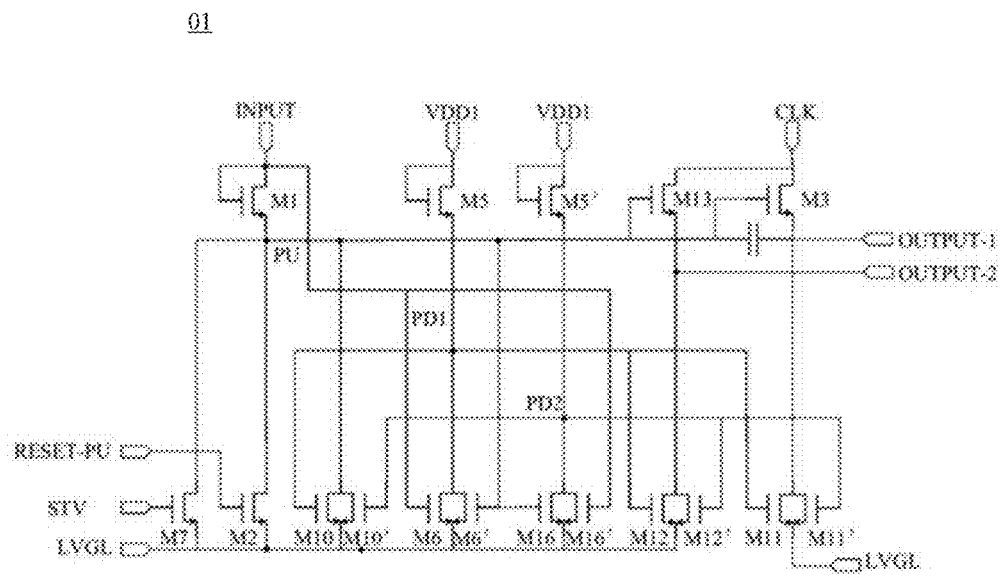
FIG. 8 is an exemplary circuit diagram of another shift register unit provided by at least one embodiment of the present disclosure.

FIG. 8 is an exemplary circuit diagram of another shift register unit provided by at least one embodiment of the present disclosure. Each thin film transistor in FIG. 8 performs similar functions as the corresponding thin film transistor in FIG. 7, for example, the third transistor M3 and the thirteenth transistor M13 are the first and second output transistors respectively, and the second transistor M2 is a reset transistor. The connection relationship between the transistors and capacitor is shown in FIG. 8, and the repeated portions are omitted herein. The exemplary circuit of the shift register unit shown in FIG. 8 can be understood with reference to the description of FIG. 7 by conventional techniques in the field.

For example, in the shift register unit shown in FIG. 8, the total widths W of the channel regions of the third transistor M3 and the thirteenth transistor M13 are relatively large, and the drifts Δth of the threshold voltages are particularly large, and the heat generation problem is particularly serious. For example, both the third transistor M3 and the thirteenth transistor M13 satisfy P≥3 and N≥2, that is, both the first output transistor and the second output transistor satisfy P≥3 and N≥2; alternatively, both the third transistor M3 and the thirteenth transistor M13 satisfy P×N≥12, that is, both the first output transistor and the second output transistor satisfy P×N≥12; alternatively, both the third transistor M3 and the thirteenth transistor M13 satisfy P×N≥16, that is, both the first output transistor and the second output transistor satisfy P×N≥16, so as to better reduce the drifts Δth of the threshold voltages of the third transistor M3 and the thirteenth transistor M13, reduce the heat generation degree of the third transistor M3 and the thirteenth transistor M13, ensure the shift register unit to have better and more stable working performance, and ensure a display panel adopting a gate driving circuit including the shift register unit 01 as a scanning driving circuit to have better display effect.

For example, in the shift register unit provided by the embodiment of the present disclosure, the third transistor M3 and the thirteenth transistor M13 are transistors shown in FIG. 3A, respectively, the thirteenth transistor M13 satisfies 112≤W/L≤400, and in the thin film transistor M13, P=3 and N=2. The third transistor M3 satisfies 112≤W/L≤400, and in the thin film transistor M3, P=4 and N=3.

For example, the third transistor M3 satisfies 235≤W/L≤400, and P×N≥32. For example, the third transistor M3 and the thirteenth transistor M13 are the transistors shown in FIG. 3B, respectively. The thirteenth transistor M13 satisfies 112≤W/L≤400, and in the thin film transistor M13, P=4 and N=4. The third transistor M3 satisfies 112% W/L≤400, and in the thin film transistor M3, P=8 and N=4.

For example, the first transistor M1, the second transistor M2, the sixth transistor M6/M6', the tenth transistor M10/M10', the eleventh transistor M11/M11' and the sixteenth transistor M16/M16' are all thin film transistors provided by the embodiments of the present disclosure, and all satisfy 12≤W/L≤400, and both P and N are integers greater than or equal to 1, M is greater than or equal to 2, and P×N≥4. Therefore, according to the relationship between the values of W/L and P and N, the design boundary of the numbers of P and N can be controlled, and the design rules are more clear, so that on the basis of foreseeable amelioration of the heat generation problem, in the display panel adopting the GOA driving circuit of the shift register unit, it is possible to reasonably arrange a plurality of thin film transistors in the limited GOA region (non-display region, e.g., at least partially surrounding the display region), arrange more shift register units to drive more rows of pixels in the display region of the display panel, which is beneficial to driving the display panel with high PPI. Moreover, in the GOA region of the display panel with high PPI, the arrangement of thin film transistors in the GOA driving circuit is more dense. In this case, it is particularly needed to ameliorate the heat dissipation of the thin film transistors. According to the relationship between the value of W/L and the product of P and N, the design boundary can be effectively obtained, the heat generation problem of the thin film transistor can be ameliorated, and the problem that the drift Δth of the threshold voltage of the thin film transistor is too large can be prevented.

For example, the design data adopted by each thin film transistor in the shift register unit 01 shown in FIG. 8 are provided in the following table 2. By adopting this technical solution, each thin film transistor can be designed reasonably according to the functional requirements of each thin film transistor, taking into account the space and performance.

TABLE 2 data of the thin film transistors in a shift register unit

| TFT label | Total width W(μm) of channel region | Number P of source-drain unit in a preferable embodiment | Total number N × P of source branches in a preferable embodiment | Range of number P of source-drain units | Range of total number N × P of source branches |
|---|---|---|---|---|---|
| M1 | 400 | 2 | 8 | 1~8 | 1~20 |
| M2 | 150 | 2 | 4 | 1~6 | 1~10 |
| M3 | 2100 | 8 | 32 | 1~30 | 1~100 |
| M5/M5' | 20 | 1 | 1 | 1~4 | 1~3 |
| M6/M6' | 150 | 2 | 6 | 1~6 | 1~10 |
| M7 | 80 | 1 | 4 | 1~5 | 1~8 |
| M10/M10' | 120 | 2 | 6 | 1~6 | 1~10 |
| M11/MI1' | 240 | 2 | 6 | 1~12 | 1~20 |
| M12/M12' | 80 | 2 | 4 | 1~4 | 1~10 |
| M13/M13' | 950 | 4 | 8 | 1~15 | 1~50 |
| M16/M16' | 120 | 2 | 4 | 1~6 | 1~10 |

At least one embodiment of the disclosure further provides a gate driving circuit, and the gate driving circuit includes any one of the shift register units provided by the embodiments of the disclosure, and the gate driving circuit includes a plurality of shift register units which are cascaded; except for the shift register units from the 1-st stage to the s-th stage, the pre-charging control terminals of the shift register units of other stages are connected with the output terminals of the shift register units of previous stages which separated by at least s stages; except for the shift register units from the 1-st stage to the s-th stage, the input terminals of the shift register units of other stages are connected with the output terminals of the shift register units of previous stages which are separated by (s−1) stage; except for the shift register units of the last s stages, the reset terminals of other shift register units are connected with the output terminals of the shift register units of previous stages which are separated by (s−1) stages, where s is an integer greater than 2.

At least one embodiment of the present disclosure further provides a display panel including the gate driving circuit provided by any one of the embodiments of the present disclosure. For example, the display panel provided by the embodiment of the present disclosure may be an organic light emitting diode display panel or a liquid crystal display panel.

Figure 9:
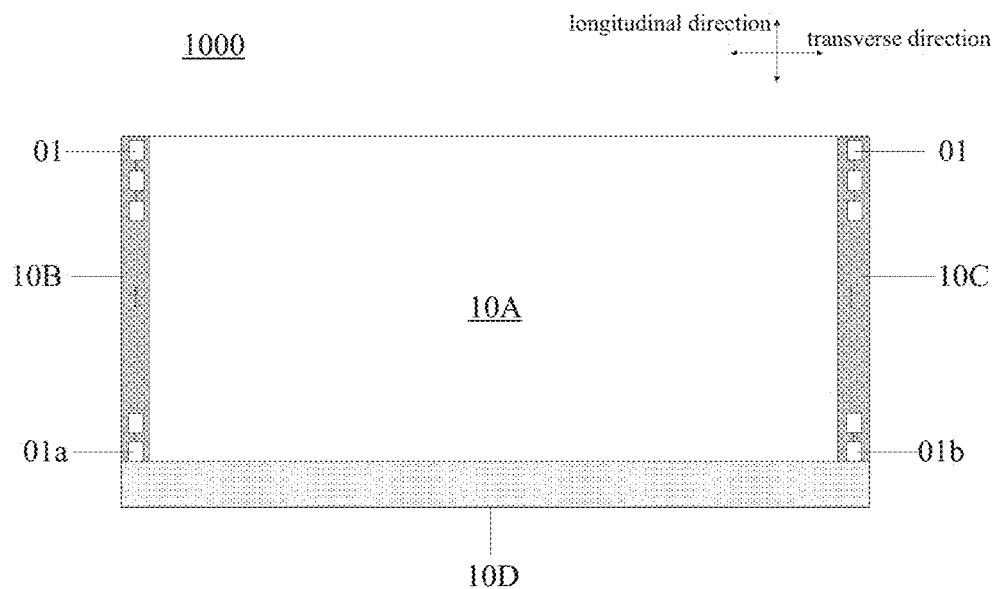
FIG. 9 is a schematic diagram of a display panel provided by at least one embodiment of the present disclosure.

FIG. 9 is a schematic diagram of the display panel provided by at least one embodiment of the present disclosure. As illustrated by FIG. 9, for example, the display panel 1000 includes a display region 10A and a non-display region surrounding at least a part of the display region 10A. The non-display region includes a gate driving circuit region 10B/10C and a circuit lead wire region 10D. For example, the non-display region includes a first circuit region 10B and a second circuit region 10C. For example, both the first circuit region 10B and the second circuit region 10C extend along a longitudinal direction, and in the regions where the first circuit region 10B and the second circuit region 10C respectively extend along the longitudinal direction, a plurality of shift register units 01 which are cascaded are provided, and the plurality of shift register units 01 are arranged along the longitudinal direction; the circuit lead wire region 10D, e.g., the fanout region, is provided with circuit lead wires (not shown), and the circuit lead wire region 10D extends along a transverse direction intersecting with the longitudinal direction and is adjacent to the gate drive circuit region 10B/10C; the circuit lead wires includes a first lead wire connected to the gate drive circuit and a second lead wire connected to the display region 10A; the plurality of shift register units 01 which are cascaded include a first end shift register unit 01a located at one end of the first circuit region JOB close to the circuit lead wire region 10D and a second end shift register unit 01b located at one end of the second circuit region 10C close to the circuit lead wire region 10D. The value of P×N of the first output transistor in the first end shift register unit Ola and the value of P×N of the second output transistor in the first end shift register unit 01a are respectively greater than the value of P×N of the first output transistor in other shift register units, in the plurality of shift register units 01 which are cascaded, located in the first circuit region 10B and the value of P×N of the second output transistor in the first end shift register unit Ola. In the display panel, the wirings at the position of the first end shift register unit Ola and a region of the circuit lead wire region 10D close to the first end shift register unit Ola are dense, and the heat generation is particularly serious. By adopting this technical solution, the heat generation degree of the serious heat generation region can be effectively reduced, the performance of the gate driving circuit can be improved, the display effect can be improved, and the service life of the circuit in this region can be improved. Similarly, the same is true for the second end shift register unit 01b, in which the value of P×N of the first output transistor in the second end shift register unit 01b and the value of P×N of the second output transistor in the second end shift register unit 01b are respectively greater than the values of P×N of the first output transistors in the other shift register units in the plurality of shift register units 01 which are cascaded and located in the second circuit region 10C and the value of P×N of the second output transistor in the second end shift register unit 01b. Herein, the first output transistor and the second output transistor refer to the first output transistor and the second output transistor in the previous embodiment about the shift register unit, and refer to the previous description for details.

For example, at least one embodiment of the present disclosure also provides a display device including the display panel provided by any embodiment of the present disclosure. For example, the display device can be any product or component with display function such as a liquid crystal panel, a liquid crystal television, a display, an OLED panel, an OLED television, an electronic paper display device, a mobile phone, a tablet computer, a notebook computer, a digital photo frame, a navigator, etc. The display device may also include other conventional components, which is not limited by the embodiment of the present disclosure.

What has been described above is only exemplary embodiments of the present disclosure, and is not used to limit the protection scope of the present disclosure, which is determined according to the scope defined by the accompanying claims.

The invention claimed is:
1. A thin film transistor, comprising:
   a source electrode, comprising a source wire and P source units electrically connected with the source wire, wherein each of the P source units comprises M source branches, and the M source branches each extends along a first direction and are arranged at intervals in a second direction intersecting the first direction;
   a drain electrode, comprising a drain wire and P drain units electrically that are connected with the drain wire and in one-to-one correspondence with the P source units, wherein each of the P drain units comprises N drain branches, and the N drain branches each extends along the first direction and are arranged at intervals in the second direction; one source unit and one corresponding drain unit constitute one source-drain unit; in each of the P source-drain units, the M source branches and the N drain branches are alternately arranged, separated from each other and insulated, and M is greater than or equal to N;
- a gate electrode, insulated from the source electrode and the drain electrode; and
- a semiconductor layer, electrically connected to the M source branches and the N drain branches in each of the source-drain units, wherein the semiconductor layer comprises a plurality of sub-channel regions located in each of the P source-drain units, and each of the sub-channel regions is located between one of the drain branches and one of the source branches that are adjacent to each other;
- a sum of widths of the plurality of sub-channel regions of the P source-drain units in the first direction is W, and an average length of the plurality of sub-channel regions of the P source-drain units in a direction perpendicular to the first direction is L;
- $12 \leq W/L \leq 400$, P, M and N are integers greater than or equal to 1, and $P \times N \geq 4$;
- the source-drain units are arranged in at least one unit row, and each unit row in the at least one unit row comprises at least one source-drain unit;
- in one same unit row, a distance between adjacent source-drain units is d, $W \geq 500$ μm, d ranges from 20 μm to 300 μm.

2. The thin film transistor according to claim 1, wherein $112 \leq W/L \leq 400$, and $P \times N \geq 6$.

3. The thin film transistor according to claim 2, wherein $P \geq 3$ and $N \geq 2$.

4. The thin film transistor according to claim 2, wherein $P \times N \geq 12$.

5. The thin film transistor according to claim 2, wherein $P \times N \geq 16$.

6. The thin film transistor according to claim 2, wherein $235 \leq W/L \leq 400$, and $P \times N \geq 32$.

7. The thin film transistor according to claim 1, wherein $W/L < 180$, and W ranges from 10 μm to 1600 μm.

8. The thin film transistor according to claim 1, wherein $W/L > 180$, and L ranges from 4 μm to 15 μm.

9. The thin film transistor according to claim 1, wherein the source-drain units are arranged in at least two unit rows.

10. The thin film transistor according to claim 1, wherein the semiconductor layer comprises a sub-portion overlapping with each source-drain unit in the plurality of source-drain units, and a plurality of sub-portions overlapping with the source-drain units constitute a continuous integrated structure.

11. The thin film transistor according to claim 1, wherein the source-drain units are arranged in a region between the source wire and the drain wire which are adjacent to each other, so as to enable the source-drain units to be arranged into at least two unit rows, and each unit row in the at least two unit rows comprises at least one source-drain unit;
the source branches of the at least one source-drain unit in each of the unit rows are electrically connected to the same one source wire, and the drain branches of the at least one source-drain unit in each of the unit rows are electrically connected to the same one drain wire.

12. A shift register unit, comprising the thin film transistor according to claim 1.

13. The shift register unit according to claim 12, wherein the shift register unit comprises a gate row driving circuit, and the gate row driving circuit comprises an input circuit, an output circuit and a first node reset circuit;
the input circuit is connected with a first node and configured to charge the first node in response to an input signal; the output circuit is connected with the first node and configured to output an output signal at an output terminal under control of a level signal of the first node; the first node reset circuit is connected with the first node and configured to reset the first node in response to a reset signal;
the output circuit, the input circuit and the first node reset circuit all comprise the thin film transistor.

14. The shift register unit according to claim 13, wherein the output terminal comprises a shift output terminal and a scan signal output terminal; the output circuit comprises a first output transistor and a second output transistor;
a gate electrode of the first output transistor is connected with the first node, a first electrode of the first output transistor is connected with a clock signal terminal to receive a clock signal, and a second electrode of the first output transistor is connected with the shift output terminal; a gate electrode of the second output transistor is connected with the first node, a first electrode of the second output transistor is connected with the clock signal terminal to receive the clock signal, and a second electrode of the second output transistor is connected with the scan signal output terminal; the clock signal is transmitted to the output terminal as the output signal;
the first output transistor and the second output transistor are both the thin film transistors;
the first output transistor and the second output transistor both satisfy $P \geq 3$ and $N \geq 2$, or,
the first output transistor and the second output transistor both satisfy $P \times N \geq 12$, or,
the first output transistor and the second output transistor both satisfy $P \times N \geq 16$.

15. The shift register unit according to claim 14, wherein the first output transistor satisfies $235 \leq W/L \leq 400$, and $P \times N \geq 32$.

16. A gate driving circuit, comprising the shift register unit according to claim 12, wherein the gate driving circuit comprises a plurality of shift register units which are cascaded;
except for shift register units from a 1-st stage to a s-th stage, pre-charging control terminals of shift register units of other stages are connected with the output terminals of shift register units of previous stages which are separated by at least s stages;
except for the shift register units from the 1-st stage to the s-th stage, input terminals of the shift register units of other stages are connected with the output terminals of shift register units of previous stages which are separated by (s−1) stages;
except for shift register units of last s stages, the reset terminals of shift register units of other stages are connected with the output terminals of shift register units of previous stages which are separated by (s−1) stages;
wherein s is an integer greater than 2.

17. A display panel, comprising the gate driving circuit according to claim 16.

* * * * *